(12) United States Patent
Massoumi et al.

(10) Patent No.: US 7,555,048 B1
(45) Date of Patent: Jun. 30, 2009

(54) HIGH-SPEED SINGLE-ENDED INTERFACE

(75) Inventors: Ali Massoumi, Morgan Hill, CA (US); Chandrasekhara Somanathan, Milpitas, CA (US)

(73) Assignee: Neascape, Inc., Milpitas, CA (US)

( * ) Notice: Subject to any disclaimer, the term of this patent is extended or adjusted under 35 U.S.C. 154(b) by 526 days.

(21) Appl. No.: 10/997,329

(22) Filed: Nov. 24, 2004

Related U.S. Application Data

(60) Provisional application No. 60/524,522, filed on Nov. 24, 2003.

(51) Int. Cl.
*H04K 1/10* (2006.01)
(52) U.S. Cl. .......................... 375/260; 375/354; 375/365
(58) Field of Classification Search .................. 375/365, 375/354
See application file for complete search history.

(56) References Cited

U.S. PATENT DOCUMENTS

| | | | | |
|---|---|---|---|---|
| 6,009,534 | A * | 12/1999 | Chiu et al. .................. | 713/503 |
| 6,101,197 | A * | 8/2000 | Keeth et al. ................ | 370/517 |
| 6,369,661 | B1 * | 4/2002 | Scott et al. .................... | 331/45 |
| 6,977,959 | B2 * | 12/2005 | Brunn et al. ................ | 375/219 |
| 6,999,547 | B2 * | 2/2006 | Braceras et al. ............. | 375/371 |
| 7,058,120 | B1 * | 6/2006 | Lu et al. ...................... | 375/214 |
| 7,282,973 | B1 * | 10/2007 | Charagulla et al. .......... | 327/158 |
| 2003/0095009 | A1 * | 5/2003 | Gomm et al. .................. | 331/57 |
| 2004/0130487 | A1 * | 7/2004 | Hoffmann et al. ........... | 342/359 |
| 2004/0150445 | A1 * | 8/2004 | Gomm et al. ................ | 327/158 |
| 2004/0257137 | A1 * | 12/2004 | Chang ........................ | 327/233 |
| 2005/0001665 | A1 * | 1/2005 | Lin ............................. | 327/238 |

OTHER PUBLICATIONS

IEEE802.11a, "Wireless LAN Medium Access Control (MAC) and Physical Layer in the 5 GHz band", pp. 12-13, IEEE, 1999.*

* cited by examiner

*Primary Examiner*—Juan A Torres
(74) *Attorney, Agent, or Firm*—Townsend and Townsend and Crew LLP

(57) ABSTRACT

Circuits, methods, and apparatus for transmitting, receiving, aligning and re-synchronizing high-speed single-ended signals by aligning a clock signal to one or more received data signals. A receiver amplifier circuit senses and captures low swing single ended signals at the receiver. Alignment is done on a per pin basis where a clock signal is distributed and independently phase shifted and aligned to each incoming data signal. In one example, a preamble containing a training data pattern is transmitted. The receiver steps through a number of dynamic timing alignment codes, each of which selects a different phase-shifted clock signal. The received data is examined for errors and the optimal clock signal is selected. Periodic dynamic readjustments of multiple clock alignment circuits may be made to compensate for temperature and voltage drift and variations.

21 Claims, 20 Drawing Sheets

Timing Diagram of DTA Pulse-training Sequence

```
m1  m2  m3  m4  m5  m6  m7  m8
 0   0   1   1   1   1   1   0
 ┊   ┊   ┊   ┊   ┊   ┊   ┊   ┊
 ▼   ▼   ▼   ▼   ▼   ▼   ▼   ▼
 0   0   0   1   1   1   0   0   ←——— 1st Pass Output
 ┊   ┊   ┊   ┊   ┊   ┊   ┊   ┊
 ▼   ▼   ▼   ▼   ▼   ▼   ▼   ▼
 0   0   0   0   1   0   0   0   ←——— 2nd Pass Output
```

HIGH-SPEED SINGLE-ENDED INTERFACE

This application claims priority from U.S. provisional application No. 60/524,522, filed Nov. 24, 2003, which is incorporated by reference.

BACKGROUND

The present invention relates to data interfaces in general, and high-speed single-ended interfaces in particular.

There are various types of signaling schemes that may be used by data interfaces that transmit and receive data. For example, data interfaces may use single-ended, differential, or other types of signaling schemes.

Differential signals require two separate signal components, each on a separate conductor, such as an integrated circuit or printed-circuit (PC) board trace. Typically, signals on each of these conductors switch in opposition to each other, for example, one signal component may transition from high to low when the other transitions from low to high. Each signal component in a differential signal pair is generated by a separate driver stage and is received by a separate receive stage.

Single-ended signals require only one signal and therefore one conductor, saving on the number of wires and their required area on a chip or PC board as compared to differential signaling. Often, single-ended signals switch in opposition to a reference voltage. This reference voltage can be shared between several single ended signals, again saving on the number of conductors. A single ended signal requires only one driver stage and one receive stage. Thus, using single ended signaling saves on the number of drivers and receives needed, and correspondingly saves power. When single-ended signals are used to transmit data from one integrated circuit to another, the reduction in the number of conductors needed means that only half the number of integrated circuit package pins are needed as compared to differential signals.

For these reasons, it is desirable to use single ended signals when transmitting data, particularly from one integrated circuit to another. But several factors can conspire to corrupt a single-ended signal and cause errors in data transmission.

These noise factors such as simultaneous switching noise (SSN), inter symbol interference (ISI), ground bounce, coupling, crosstalk, package contacts, board via and transmission line effect and other similar factors can be generally grouped into those that cause skew between signals and those that cause jitter on a signal. Skew between signals can be caused by mismatches in circuits that generate the signals, for example, one driver may provide more current than another driver. Skew can also result from mismatches in loading such as mismatches between trace lines, bond wires, lead frame lengths and inductances, parasitic capacitance mismatches, and the like. Jitter on a signal can be caused by noise, intersymbol interference (ISI), and other phenomena.

Skew and jitter are particularly destructive in a synchronous (clocked) interface that includes several parallel data channels. For optimal data transfer, the synchronizing clock signal should be aligned to the center of each bit of data in each of the received data signals. But skew and jitter move signals in time relative to each other and to the synchronizing clock signal. This makes accurate data reception at the receiving end difficult and error prone. In high-speed interface circuits, this is more pronounced since each data bit is shorter, the same amount of skew and jitter lead to more transmission errors.

Thus, what is needed are circuit, methods, and apparatus for high-speed single-ended data transfers from one integrated circuit to another that can compensate for various noise effects and related skew and jitter effects on between signals. It is also desirable to compensate for the jitter on a signal.

SUMMARY

Accordingly, exemplary embodiments of the present invention provide circuits, methods, and apparatus that transmit and receive high-speed single-ended signals by aligning a clock or other synchronizing signal to one or more received data signals. Alignment may be done on a per-bit basis where one clock signal is distributed and independently phase shifted and aligned to each incoming received signal. This clock alignment compensates for skew between data signals and between data signals and their clock. The ISI portion of jitter can be compensated for at the transmitting end by incorporating pre-emphasis techniques.

In a specific embodiment of the present invention, a preamble or other appropriate data pattern is transmitted by a first integrated circuit and received by a second integrated circuit. The receiver on the second integrated circuit steps through a number of dynamic timing alignment codes, each of which provides a different phase-shifted clock signal. The code corresponding to the aligned clock signal that correctly receives the transmitted data pattern is selected and stored. If multiple aligned clock signals sample the correct data pattern, the clock signal at the center of the set of the correctly aligned clock signals is selected and stored. Codes for multiple alignment circuits may be stored separately on a per bit (per pin) basis. Periodic dynamic readjustments of the clock alignment circuits may be performed to compensate for temperature drift, voltage changes, and other environmental variations.

One exemplary embodiment utilizes two alignment circuits. The two alignment circuits include a coarse alignment and a fine alignment. The coarse alignment includes selecting one clock signal from a number of clock signals, each phase shifted from the others. The fine alignment includes further phase shifting the coarse-aligned clock within the narrower coarse step to correctly sample the transmitted data. Again, the clock alignments may be done on a per-bit basis, that is, each input pin may have its own coarse and fine alignment circuits. Alternately, the coarse alignment circuit may be shared by multiple inputs, with an independent fine alignment circuit for each data bit channel or data pin. Alternately, both circuits may be shared by multiple input data pins. Alternately, data signals may be phase shifted and aligned to a clock signal following the same or similar procedures described. Various embodiments of the present invention may incorporate one or more of these and the other features described herein.

A better understanding of the nature and advantages of the present invention may be gained with reference to the following detailed description and the accompanying drawings.

BRIEF DESCRIPTION OF THE DRAWINGS

FIG. 14B is a block diagram of a phase interpolator that may be used as the phase interpolator in FIG. 11A, while

DESCRIPTION OF EXEMPLARY EMBODIMENTS

Figure 1:
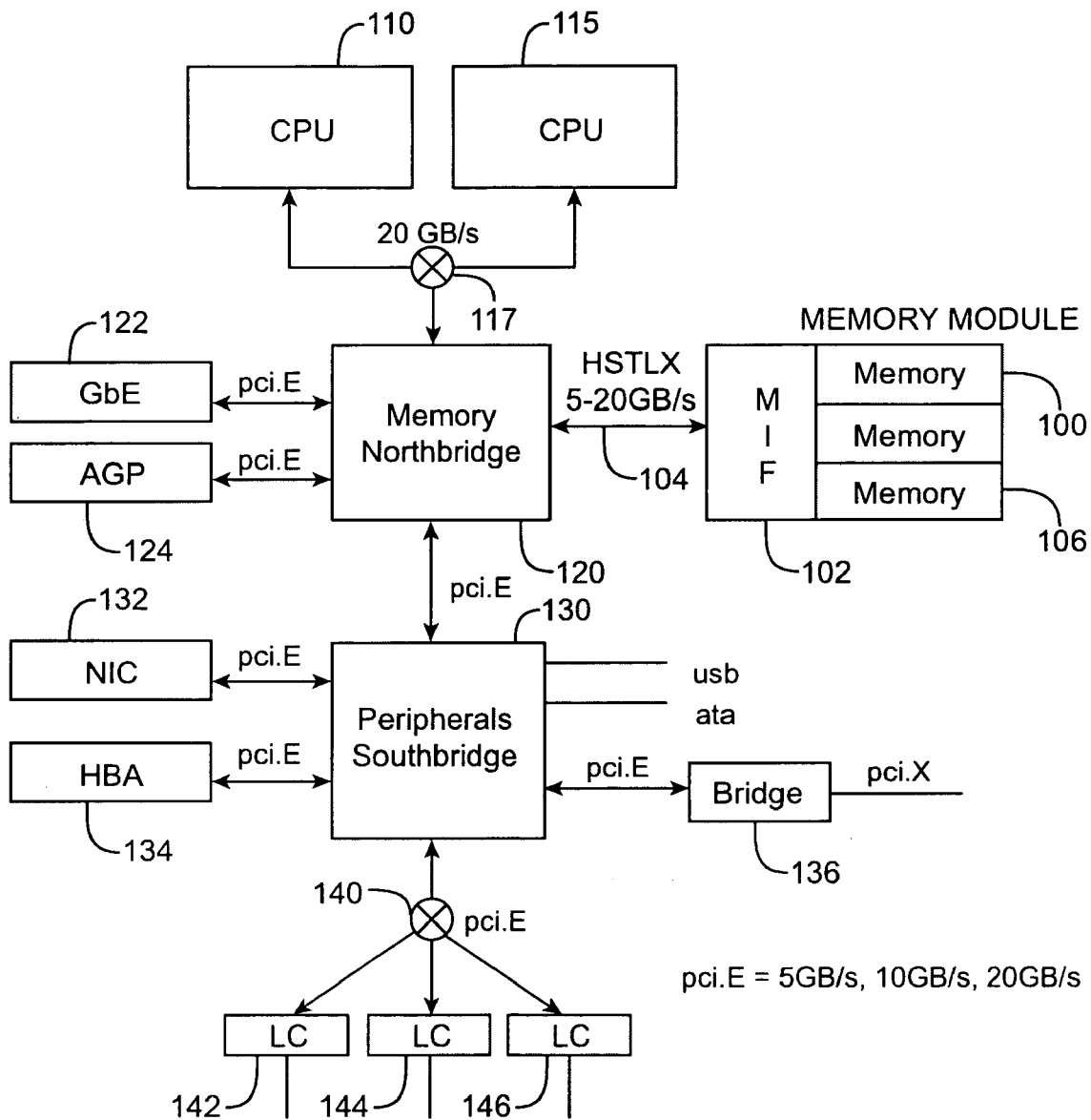
FIG. 1 is a block diagram of a computer system that incorporates one or more embodiments of the present invention.

FIG. 1 is a block diagram of a computer system that incorporates one or more embodiments of the present invention. This block diagram includes a memory module 100, CPUs 110 and 115, Memory Controller (Northbridge) 120, and Peripheral IO Controller (Southbridge) 130. The Northbridge 120 is connected to the system memory, the memory module 100, which includes memory 106, via a high speed HSTLX interface 102 over lines 104. The Northbridge 120 is further connected to a Gigabit Ethernet (GbE) network 122 and an Advanced Graphics Port (AGP) bus 124. The Southbridge 130 is further connected to a network interface card (NIC) 132, host bus adapter (HBA) 134, PCI bridge 136, and peripheral component interface (PCI) multiplexer or hub 140, which is further connected to line cards 142, 144, and 146. This figure, as with the other included figures, is included for exemplary purposes only and does not limit either the embodiments of the present invention or the claims. For example, in the following figures, specific numbers of inputs, phase-shifted clock signals, and the like are given as examples. In other embodiments of the present invention, different numbers of these may be included.

A specific embodiment of the present invention particularly benefits data transfers to and from the system memory. This embodiment provides a high-speed source-synchronous parallel interface between the Northbridge 120 and the system memory, in this case the memory module 100. This may be referred to as a high-speed single-ended (HSSE) connection or interface. Alternately, since this connection is an improvement on an HSTL compliant connection, it may be referred to as an HSTLX connection or interface. The memory module may be a memory module such as those described in co-pending U.S. application Ser. No. 10/997, 325, titled "High-Speed Memory Module," which is incorporated by reference.

Other embodiments of the present invention may be used to improve other connections between devices in this computer system. For example, the interface 117 between the CPUs 110 and 115 and the Northbridge 120 may be improved by embodiments of the present invention. Also, embodiments of the present invention may be used to improve the interface between different portions of circuitry in the same device. For example, the interface between two portions of the Northbridge 120 or CPUs 110 and 115 may be connected to each other using an embodiment of the present invention.

Figure 2A:
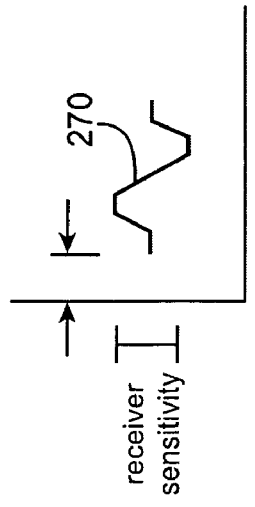
FIG. 2A is an exemplary waveform provided by a high-speed single-ended transmitter.

FIG. 2A is an exemplary waveform provided by a high-speed single-ended transmitter. This transmitter may be located, for example, on Northbridge 150, memory module 100, or other circuit. The waveform 200 is transmitted with a robust amplitude and desirable rise and fall times. In fact, various embodiments provide controlled rise and fall times as well as accurate on-chip terminations to eliminate or reduce ringing and reflection. Also, pre-emphasis may be provided for applications with relatively long chip-to-chip interconnect where filtering by the load described below becomes excessive.

Figure 2C:
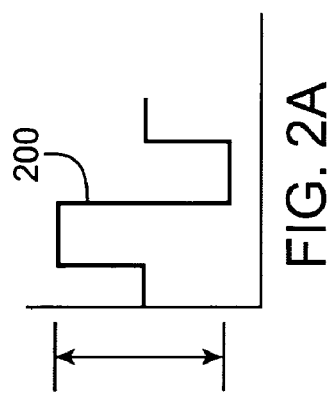
FIG. 2C is an exemplary waveform received by a high-speed single-ended receiver.
Figure 2B:
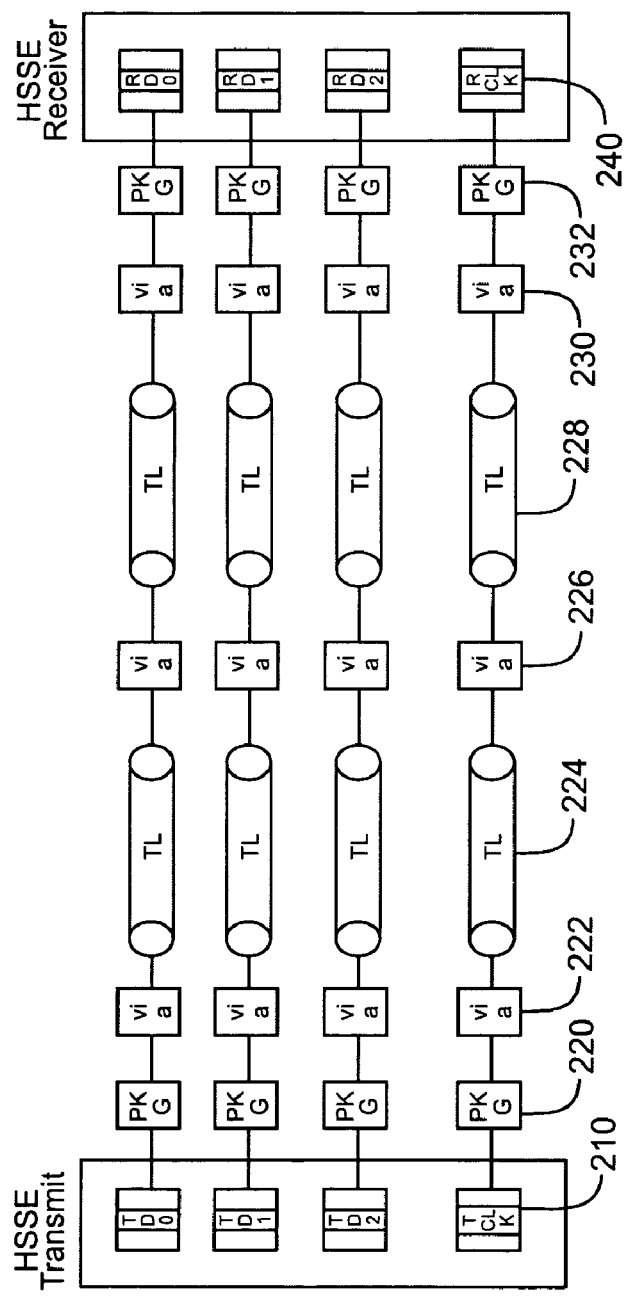
FIG. 2B illustrates the signal path components that cause skew between single-ended signals and degradation of a single ended signal.

FIG. 2B illustrates the signal path components that cause skew between single-ended signals and degradation of a single-ended signal. The signal path for each pin includes the transmitter 210, package 220—which possibly includes bond wires, package lead-frame, and pad and ESD protection—via 222, trace lengths 224 and 228 broken up by via 226, via 230, receiver package 232, and receiver circuitry 240. The stray capacitances and series inductances and resistances in this path degrade the rising and falling edges of the transmitted signal and act as a filter that attenuates its amplitude. FIG. 2C is an exemplary waveform 270 received by a high-speed single-ended receiver.

Figure 3A:
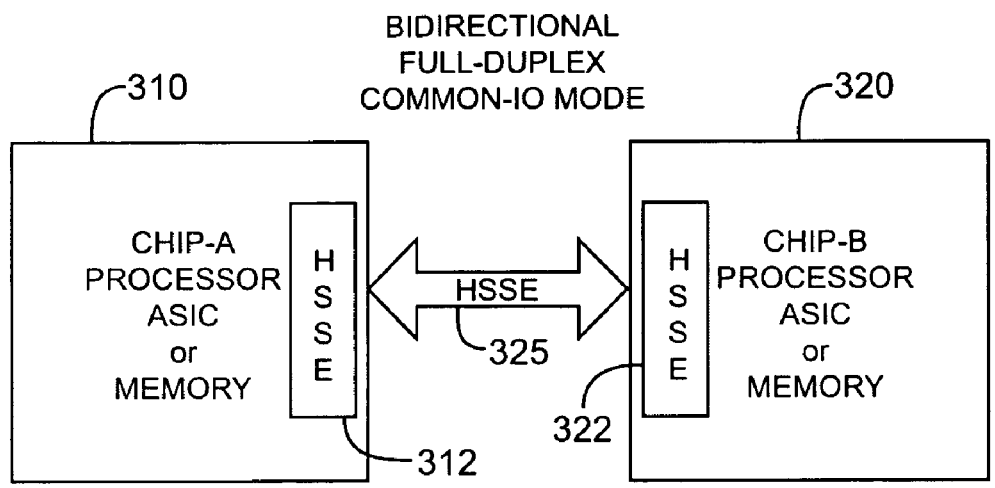
FIG. 3A illustrates a first integrated circuit communicating with a second integrated circuit over a high-speed single-ended bidirectional interface and FIG. 3B illustrates a first integrated circuit and a second integrated circuits communicating with each other over high-speed single-ended unidirectional interfaces.

FIG. 3A illustrates an embodiment of the present invention where a first integrated circuit communicates with a second integrated circuit over a high-speed single-ended bidirectional interface. The first integrated circuit 310 and the second integrated circuit 320 may be a processor, ASIC, memory, or other type of device. The first integrated circuit 310 includes a first high-speed single-ended interface 312, while the second integrated circuit 320 includes a second high-speed single-ended interface 322. The first and second integrated circuits communicate with each other in a bidirectional or full duplex mode over high-speed single-ended bidirectional bus 325 via their high-speed single-ended interfaces 312 and 322. The HSSE interfaces in this and the other figures may alternately be referred to as HSTLX interfaces.

Figure 3B:
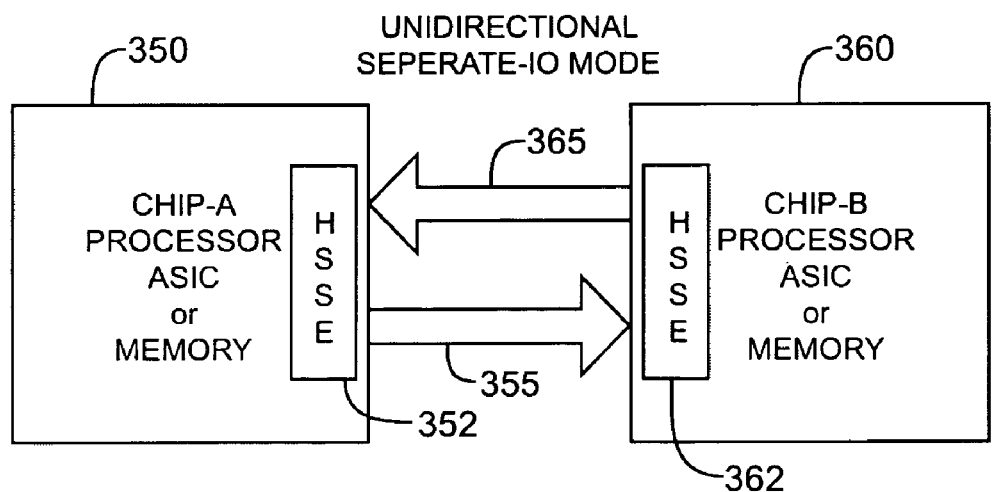

FIG. 3B illustrates an embodiment of the present invention where a first integrated circuit 350 and a second integrated circuit 360 communicates with each other over high-speed single-ended unidirectional interfaces 355 and 365. The first integrated circuit 350 and the second integrated circuit 360 may be a processor, ASIC, memory, or other type of device. The first integrated circuit 350 includes a high-speed single-ended interface 352, while the second integrated circuit 360 includes a high-speed single-ended interface 362. The first integrated circuit and the second integrated circuits communicate with each other via the high-speed single-ended interfaces 352 and 362 using unidirectional buses 355 and 365. Specifically, integrated circuit 350 sends data to integrated circuit 360 using bus 355, while integrated circuit 360 sends data to the first integrated circuit 350 using high-speed single-ended bus 365.

Single-ended signals are signals that are carried on a single line or wire. Typically, they have a DC component or offset around which a signal such as an AC voltage component varies. They may alternately be considered as changing or transitioning between two or more levels, for example, logic signals transition between two logic levels. However, after passing from one chip to another, for example over a printed-circuit board trace as shown in FIG. 2B, such a logic signal may become rounded, and may exhibit ringing characteristics or other artifacts, particularly at high data transfer rates. Accordingly, proper data detection and recovery at the receiving end may become difficult.

To avoid this difficulty, prior art solutions have used differential signaling. Differential signals are often complementary in nature, that is as one signal increases in voltage, the other decreases. But single-ended signaling techniques have an advantage over differential signaling in that single-ended signals require only one wire, one driver, and one receiver while differential signals typically require two wires, two drivers, and two receivers, as discussed above. Thus, embodiments of the present invention provide a benefit in reducing the number of wires and associated circuits and their power in a data interface by providing circuits, methods, and apparatus for single-ended transmission at high data rates.

In this and other interfaces that are consistent with embodiments of the present invention, there may be an non-binary number of input or output (or input/output) cells included in the interface. For example, these interfaces may be configurable such that they have a non-binary number of active data pins. Examples of this may be found in co-pending U.S. patent application Ser. No. 10/997,268, titled "Non-Binary High-Speed Single-Ended Interface," which is incorporated by reference.

Figure 4:
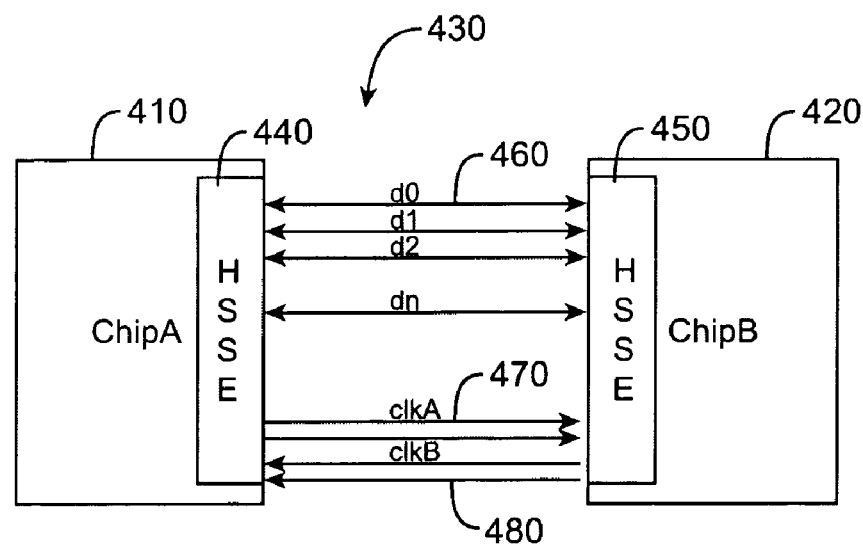
FIG. 4 is a more detailed diagram showing the data and clock pins shared between two high-speed single-ended interfaces that are consistent with an embodiment of the present invention.

FIG. 4 is a more detailed diagram showing the data and clock pins shared between two high-speed single-ended interfaces that are consistent with an embodiment of the present invention. Included are a first integrated circuit 410 and a second integrated circuit 420. The first integrated circuit 410 includes a high-speed single-ended interface 440, and the second integrated circuit 420 includes a high-speed single-ended interface 450. The high-speed single-ended interfaces 440 and 450 transfer data over data buses 430. When integrated circuit 410 transmits data on lines 460 to integrated circuit 420, the high-speed single-ended interface 440 provides a differential clock signal on lines 470 to the high-speed single-ended interface 450. When the second integrated circuit 420 transmits data on lines 460 to the first integrated circuit 410, the high-speed single-ended interface 450 provides a differential clock signal on lines 480 to the high-speed single-ended interface 440.

Figure 5:
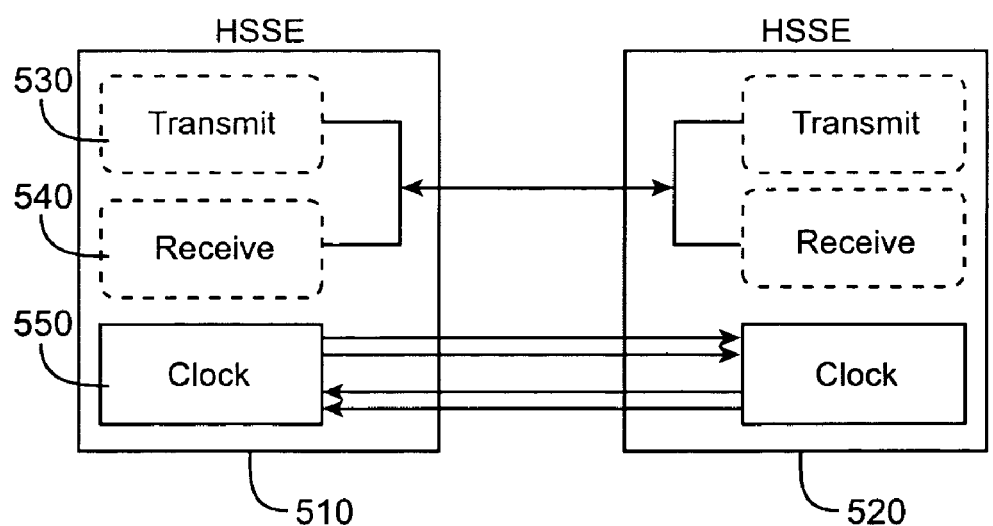
FIG. 5 illustrates the transmit and receive circuits for one data bits in a full duplex mode, as well as the differential nature of the unidirectional clock signals.

FIG. 5 illustrates the transmit and receive circuits for one data channel in a full duplex mode, as well as the bidirectional nature of the clock signals. Included are a first high-speed single-ended interface 510 and a second high-speed single-ended interface 520. Each high-speed single-ended interface includes a transmit 530, receive 540, and clock circuit 550.

Figure 6:
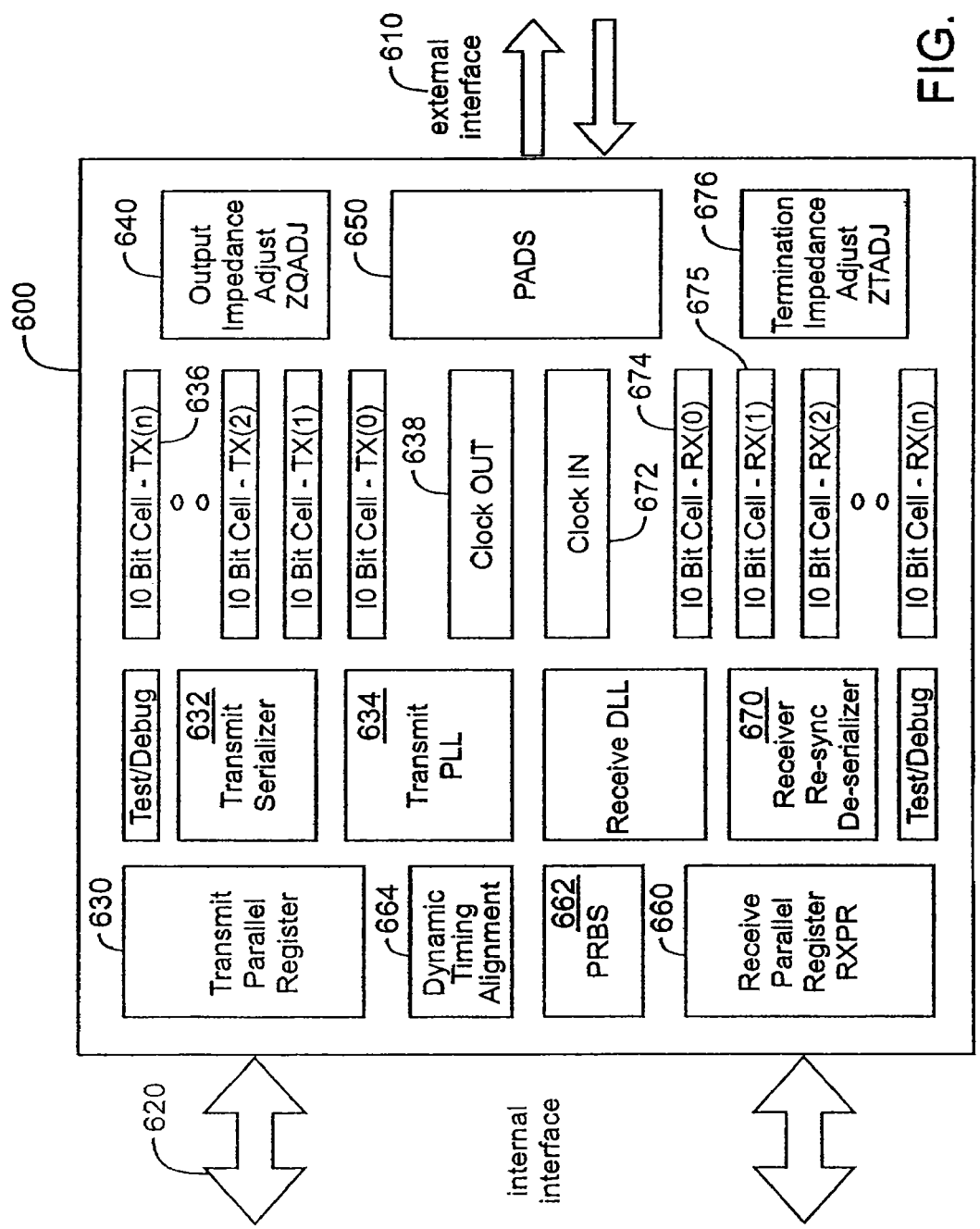
FIG. 6 illustrates the functional blocks and their placement on an integrated circuit consistent with an embodiment of the present invention.

FIG. 6 illustrates the functional blocks and their placement on an integrated circuit consistent with an embodiment of the present invention. This figure includes an integrated circuit interface 600 having connections 620 with the remaining portion of the integrated circuit, as well as an external interface 610.

The integrated circuit 600 receives data for transmission from the internal interface 620 with transmit parallel register 630. The transmit parallel register 630 retimes the data to an interface clock generated by the transmit PLL 634. The transmit parallel register 630 provides data to the transmit serializer 632, which converts the parallel data to a serial format. The transmit serializer provides data to the transmitters 636, which in turn provides signals to the pads 650, which are connected to the external interface 610. In the transmit mode, a clock signal is provided by the clock-out circuit 638. Termination impedances are adjusted by impedance adjustment circuit 640.

The integrated circuit 600 receives data with the receive cells 674 via the pads 650 from the external interface 610. A clock signal is also received by the clock-in circuit 672. The received serial data is de-serialized by the de-serializer circuit 670, which provides data to the parallel registers 660. Input termination impedances are adjusted by termination impendence adjustment circuit 676. Examples of input termination impedance adjustment circuits can be found in co-pending U.S. patent application Ser. No. 10/997,447, titled "On-Chip Termination for a High-Speed Single-Ended Interface," now U.S. Pat. No. 7,205,787, which is incorporated by reference.

Before data transmission, the dynamic timing alignment circuit 664 determines the clock signal phase shift necessary for each receive cell 674 to receive data and optimal manner. A separate phase shift is determined for each input cell 674 and is stored as a code, one code associated with each of the input cells 674.

In an exemplary embodiment, a preamble including a header and a training sequence is received over the external interface 610 by a bit cell 674. The receive re-synchronizer circuit 670 increments a phase shift of a received clock signal and for each increment compares data received by the bit cell 674 with expected data. From the results, the optimal phase shift is determined and a code associated with that phase shift is stored. The preamble including header and training sequence is again received, this time by a second bit cell 675, and the training sequence is performed again. When the final bit cell 674 has been adjusted, the integrated circuit 600 provides preambles including headers and training sequences to the previously transmitting integrated circuit (not shown).

A pseudorandom bit sequence circuit 662 is capable of generating a pseudorandom bit sequence for transmission over the external interface 610. This transmitted data is compared on a second integrated circuit to expected data, and from this comparison a bit-error rate (BER) for the data connection can be determined.

Figure 7:
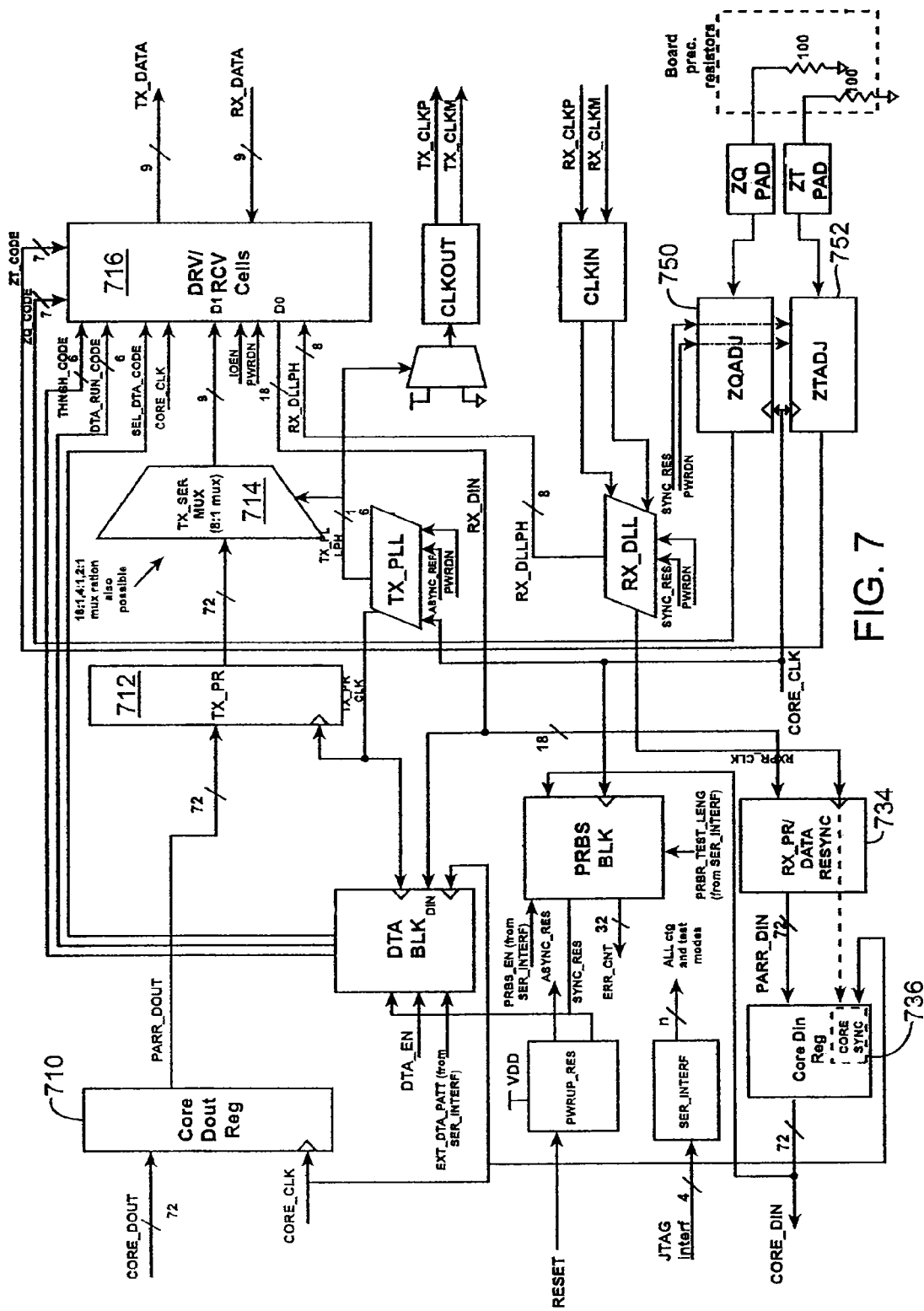
FIG. 7 is a block diagram of an integrated circuit according to an embodiment of the present invention.

FIG. 7 is a block diagram of an integrated circuit according to an embodiment of the present invention. Transmit path data is received from the circuit core by the core data out register 710, which provides parallel data to re-timing circuit 712. The re-timing circuit 712 provides data to the transmit serializer 714. The transmit serializer 714 serializers the data and provides it to the driver cells 716. The driver cells 716 provide data out to a second integrated circuit (not shown), that typically includes this or similar circuitry.

Data is received by the receive cell 716 and provided to the data re-sync circuit 734. The data re-sync circuit converts the serial data to parallel data and provides parallel data to retiming registers 736. The retiming registers 736 provide retimed parallel data to the integrated circuit core. On chip impedance terminations are adjusted by the termination impedance circuits 750 and 752.

Figure 8:
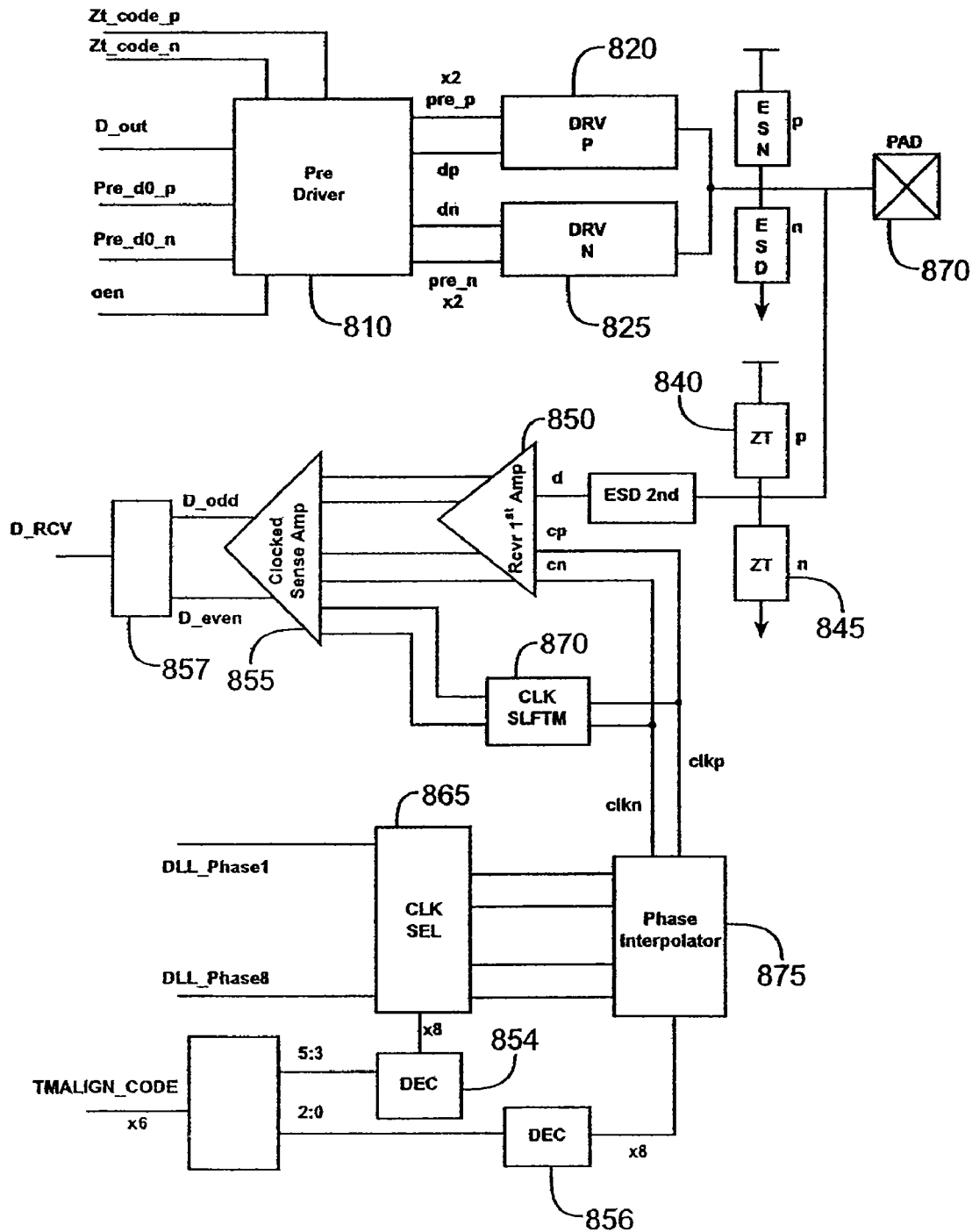
FIG. 8 illustrates a portion of the transmit and receive circuits associated with a single pin in a high-speed single-ended interface consistent with an embodiment of the present invention.

FIG. 8 illustrates a portion of the transmit and receive circuits associated with a single pin in a high-speed single-ended interface consistent with an embodiment of the present invention. The transmit path includes a pre-driver 810, p-driver 820, and n-driver 825. Data to be transmitted is received by the pre-driver circuit 810. The output of pre-driver 810 provides data signals to the p-driver 820 and n-driver 825. The pre-driver 810 can include other circuitry for terminations and tristate functions.

The receive path circuitry includes termination impedance networks 840 and 845, receiver amplifier 850, clocked sense amp 855, and clock alignment circuitry including decoders 854 and 856, coarse clock select circuitry 865, and phase interpolator 875. The clock alignment circuitry aligns the clock to the data received at the pad 870 in such a way that the errors in data reception are minimized. Specifically, a known data pattern or preamble is received at the pads 870. The alignment of the clock provided on pad 870 to the clock sense amp 855 is adjusted, and the optimal timing is found. The alignment configuration that matches the optimal timing is stored and retained. Periodically, the circuit may be recalibrated to minimize the effects of temperature fluctuations and supply variations.

This input-output cell consists of a driver section and a receiver section. The receiver section and associated clock timings are unique designs. The data is compared pseudo-differentially to the saclk_n (cn) and saclk_p (cp) signals. The outputs of the receiver amplifier 850 are two signals are near full-rail. These represent the first and second data pieces of a DDR interface. The clock timing to the receiver amplifier 850 comes from the combination of a clock mux and an phase interpolator block. The clock mux selects one of 8 DLL clock signals which are 100 ps apart. Two of the clocks are selected and fed in to the phase interpolator block which interpolate one of 8 taps from the two phases coming in. The result of this circuit block is the saclk_p (cp) and saclk_n (cn) signals which provide differential clocks to the receiver amplifier 850. These clocks also go to the clock self timer 870, which provides delayed self-timed clocks, to the second stage clocked sense amplifier 855. The output of the clocked sense amplifier 855 is the final first and second piece of data for a double-data rate (DDR) signal. These signals are registered by a flip-flop 857 and provided to the integrated circuit core.

Figure 9:
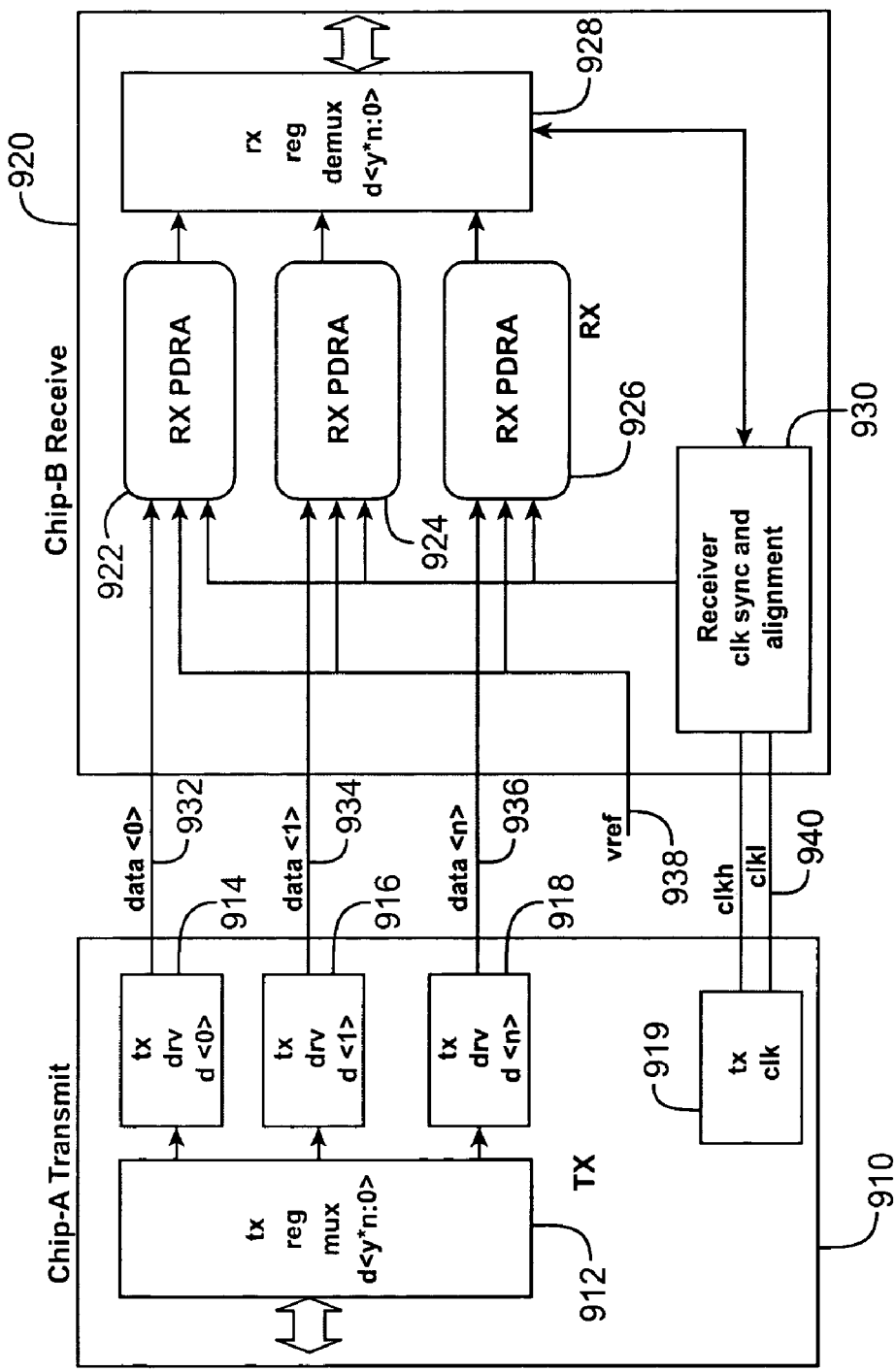
FIG. 9 is a block diagram showing the data transmission path from a first integrated circuit to a second integrated circuit that is consistent with an embodiment of the present invention.

FIG. 9 is a block diagram showing the data transmission path from a first integrated circuit 910 to a second integrated circuit 920 that is consistent with an embodiment of the present invention. The first integrated circuit 910 includes transmit circuitry including a transmit multiplexer 912, transmit drivers 914, 916, and 918 and transmit clock circuit 919. The second integrated circuit 920 includes receive circuits 922, 924, and 926, and receive register and the clock circuitry 928. The second integrated circuit also includes a receive clock synchronization and alignment circuits 930.

Data is provided by the transmit drivers 914, 916, and 918 in the first integrated circuit 910 on lines 932, 934, and 936. In various embodiment of the present invention, there may be different number of these lines. For example, there may be 8 data lines, 16 data lines, or different numbers of data lines. The incoming signals on these lines are compared to a reference voltage VREF on line 938. A clock signal is provided by the TX clock block 919 on lines 940. In a specific embodiment of the present invention, this clock signal is differential. The clock signal is received by the receiver clock sync and alignment circuit block 930 on the second integrated circuit 920. The receive sync and alignment block aligns the differential clock on lines 940 to the incoming data on lines 932, 934, and 936, on a per-bit basis.

Specifically, the transmit drivers 914, 916 and 918, provide a preamble or other known data signal. These preambles or data signals are received by the receivers 922, 924, and 926. The receiver clock sync and alignment block 930 provides clock signals having various phase alignments to the receive circuits 922, 924, and 926. For each clock phase provided, the output sampled data pattern is examined, that is, it is checked for errors. The clock phase associated with no errors, is stored for each of channel. If multiple clock phases sample the correct data, a mid-point of the set of phases is selected and stored. A specific embodiment of the present invention stores a code identifying the optimal clock phase for each pin. Alternately, in other embodiments of the present invention, this code is stored and used by more than one, or all the input pins.

Figure 10:
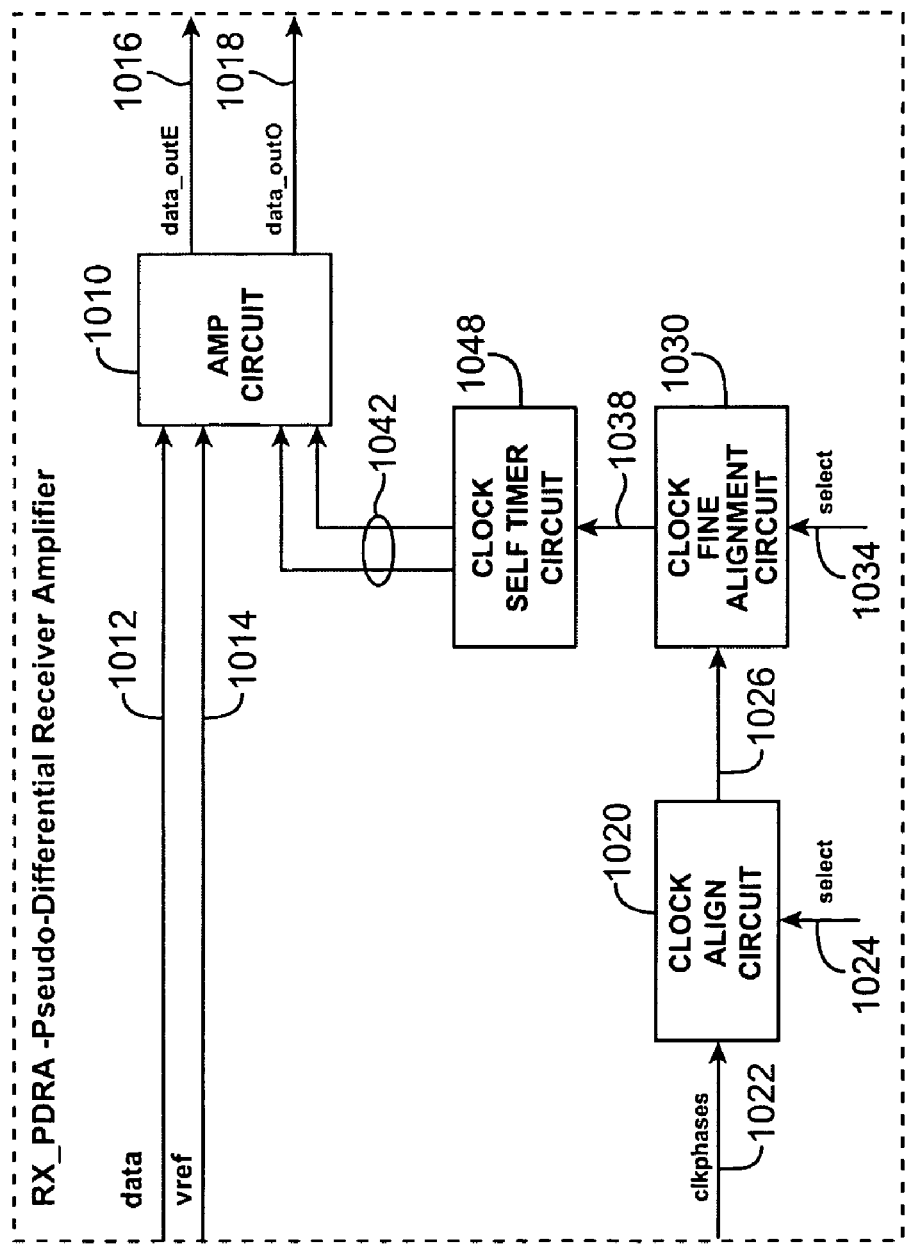
FIG. 10 is a block diagram and illustrating one of the receive circuits, such as the receive circuit in FIG. 9.

FIG. 10 is a block diagram and illustrating one of the receive circuits, such as the receive circuit 922 in FIG. 9. Included are amplifier circuit 1010, clock align circuit 1020, clock fine align circuit 1030, and clock self timer circuit 1048. Data is received on line 1012 by the amp circuit 1010. The amp circuit compares the received data signal voltage level on line 1012 to a threshold voltage VREF on line 1014. A number of clock signals, each having a relative phase shift to the others, is provided on lines 1022 to the clock align circuit 1020. A select bus or lines 1024 is used to select one of the clock phases, which is then provided on line 1026 to the clock fine align circuit 1030. The clock fine align circuit phase shifts the clock signal received on line 1026 by an amount determined by select lines 1034. The phase shifted clock signal is provided on line 1038 to the clock self timer circuit 1048. The clock self timer circuits is a narrow bandwidth device that maintains clock timing and provides a clock signal to the amp circuit on lines 1042. The amp circuit 1010 provides sampling of data on both the odd and even phase of the clock and provides the sampled data signals on even and odd output pins 1016 and 1018.

Figure 11A:
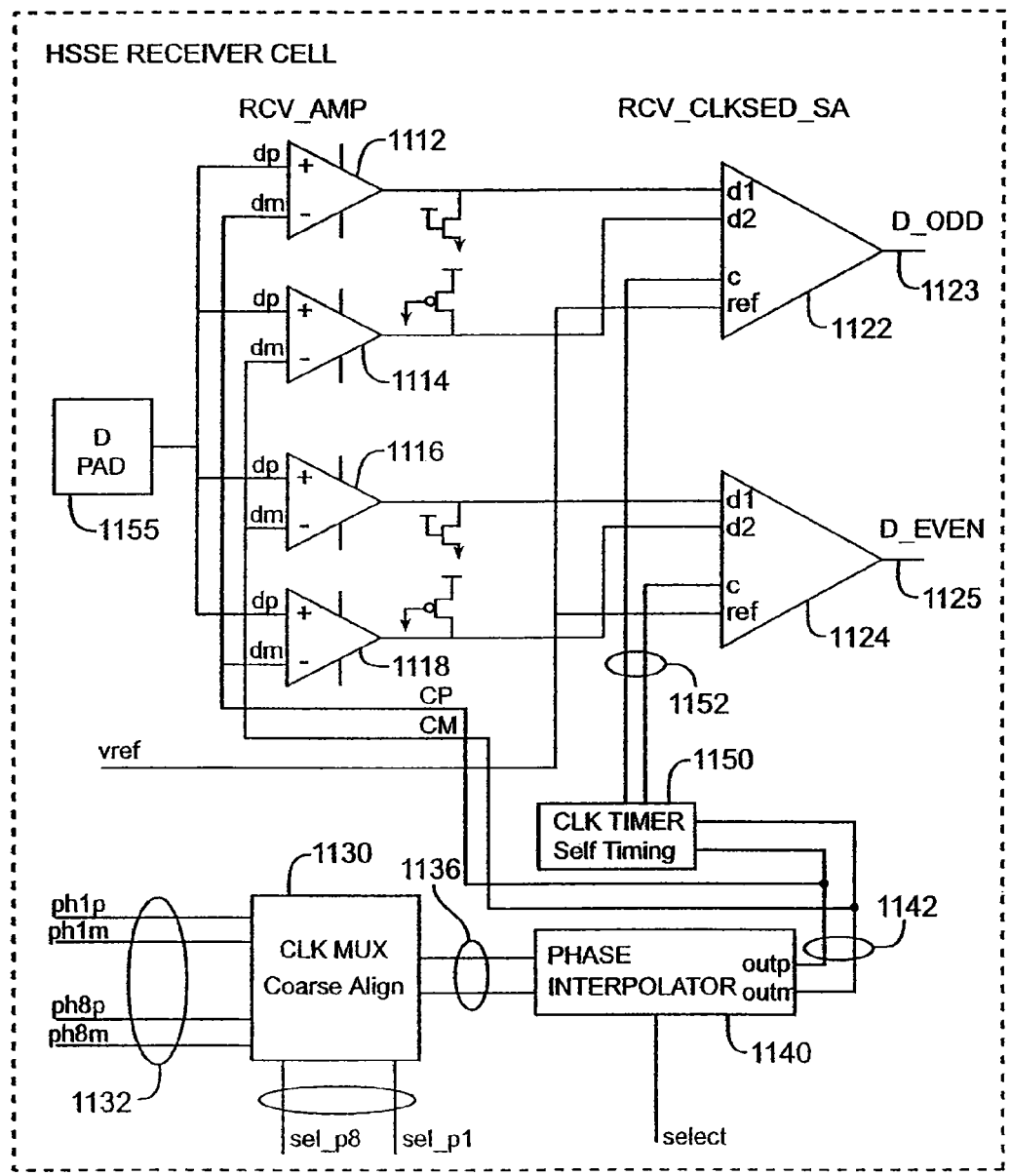
FIGS. 11A and 11B are more detailed block diagrams of receivers that may be used as the receiver 922 in FIG. 9 or as a receiver in other embodiments of the present invention.

FIG. 11A is a more detailed block diagram of a receiver that may be used as the receiver 922 in FIG. 9 or as a receiver in other embodiments of the present invention. Included are receiver amplifiers 1112, 1114, 1116, and 1118, received clock sense amps 1122 and 1124, clock mux 1130, phase interpolator 1140, and clock timer 1150.

Data is received on pad 1155 by receive amplifiers 1112, 1114, 1116, and 1118. The receive amplifiers also receive the aligned clock provided by the clocked timer 1150 on lines 1152. The receive amplifiers provide outputs to the receive clock sense amplifiers 1122 and 1124, which in turn provide odd and even data outputs on lines 1123 and 1125.

The clock multiplexer 1130 provides a coarse phase alignment while the phase interpolator 1140 provides a fine phase alignment. Specifically, a number of clocks signals that are phase shifted relative to each other are received on lines 1132 by the clock mux 1130. In a specific example, eight differential clock signals are received by the clock mux 1130. In other embodiments of the present invention, these clock signals may be single-ended, and there may be different numbers of clock signals received. After the optimal amount of coarse phase shift is determined, the two received clock signals that bound this optimal phase-shift are provided to phase interpolator 1140 on lines 1136. These two clock signals define the window in which the optimal clock phase-shift exists. The phase interpolator 1140 provides a clock signal on lines 1142 that is phase shifted an amount limited by this window. For example, the phase interpolator 1140 may track the earlier of the two clock signals, the later of the two clock signals, or it may track a combination of the two to provide a clock signal having a phase shift that places it between these extremes. The clock self timer 1150 maintains the clock timing and provides signals to the receive amps and receive clock sense amplifier on line 1152.

In a specific embodiment of the present invention, the combined alignment codes are six-bits wide. In this embodiment, a 1.25 GHz clock is received by a DLL (not shown), which generates 8 coarse clocks. These clocks are phase shifted from each other by an amount corresponding to 100 ps. These clocks are received by the clock multiplexer which provides two successive clock signals that bound the optimal phase-shift that is determined during alignment. The two successive clock signals are received by the phase interpolator, which provides a variable phase shift having 12.5 ps of resolution.

Figure 11B:
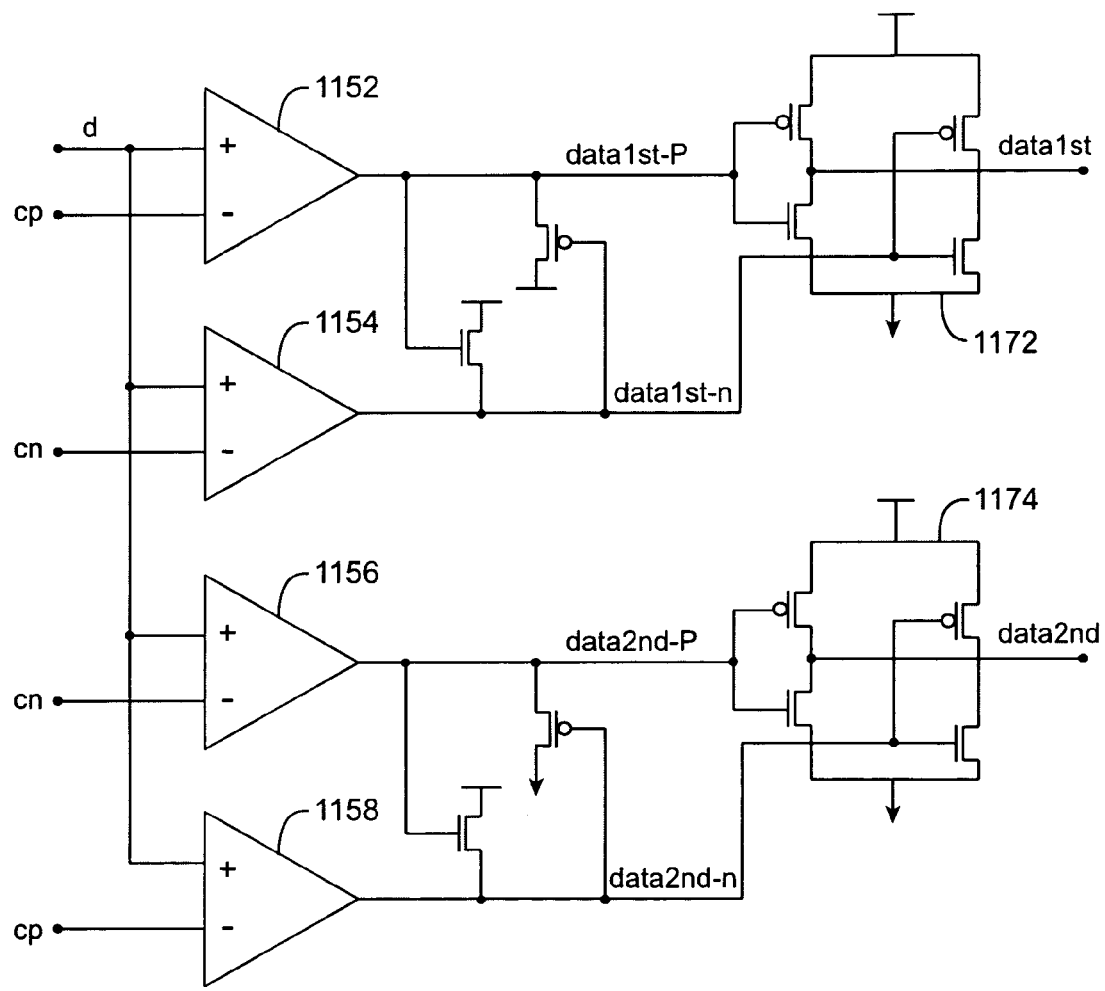

FIG. 11B is a more detailed block diagram of a receiver that may be used as the receiver 922 in FIG. 9 or as a receiver in other embodiments of the present invention. Included are receiver amplifiers 1152, 1154, 1156, and 1158, and receive sense amps 1172 and 1174. Complementary clock signals and the data are received by receive amplifiers 1152, 1154, 1156, and 1158 as before. The outputs of these amplifiers are received by sense amps 1172 and 1174 which amplify or gain the signal. Odd and even data are provided by the two sense amps.

Figure 12:
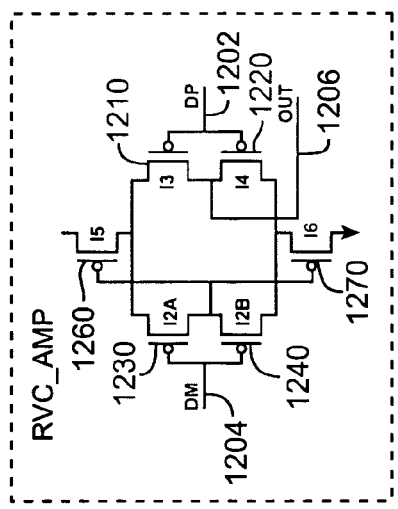
FIG. 12 is a schematic of a receive amplifier that may be used as the receive amplifiers in FIGS. 11A and 11B, or as a receive amplifier in other embodiments of the present invention.

FIG. 12 is a schematic of a receive amplifier that may be used as the receive amplifiers 1112, 1114, 1116, and 1118 in FIGS. 11A and 11B, or as a receive amplifier in other embodiments of the present invention. The receive amplifier receives inputs DP and DM on lines 1202 and 1204, and provides an output on line 1206. Input DP drives the gates of device I2A 1230 and I2B 1240, while input DM drives the gates of I3 1210 and I4 1220. Devices I5 1260 and I6 1270 are driven by the drains of device I2A 1230 and I2B 1240.

Figure 13:
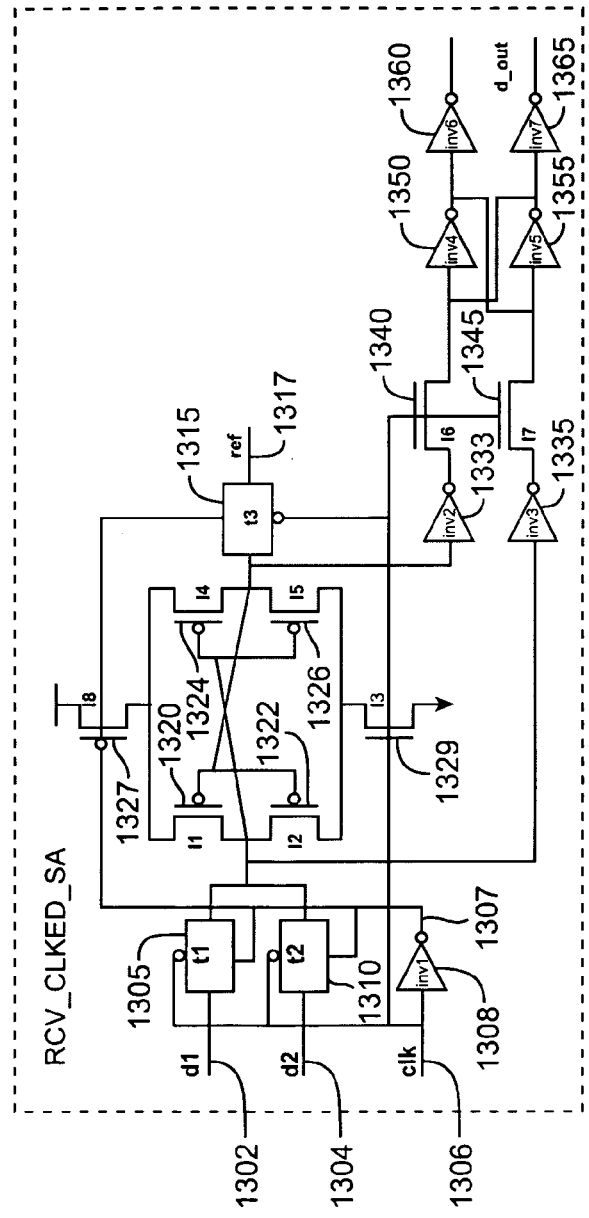
FIG. 13 is a schematic of a received clock sense amplifier that may be used as the receive clock sense amplifiers in FIG. 11A, or as a receive clock sense amplifier in other embodiments of the present invention.

FIG. 13 is a schematic of a received clock sense amplifier that may be used as the receive clock sense amplifiers 1122 and 1124 in FIG. 11A, or as a receive clock sense amplifier in other embodiments of the present invention. Included are pass gates 1305, 1310, and 1315, input sensing and latch devices I1 1320, I2 1322, I4 1324, I5 1326, I8 1327, and I3 1329, buffer inverters 1333 and 1335, pass transistors 1340 and 1345, data latch including inverters 1350 and 1355, and output buffers 1360 and 1365.

Inputs are received on lines D1 1302 and D2 1304. These inputs are multiplexed through the pass gates 1305 and 1310 by the clock signal received on line 1306 and its complement generated on line 1307 by inverter 1308. The selected signal is received by the sense amp where it is compared to a reference voltage received on line 1317. This differential voltage drives the sense amplifier devices I1 1320, I2 1322, I4 1324, and I5 1326. The output of the sense amp is buffered by inverters 1333 and 1335, and at the appropriate clock phase, passed to the output latch comprised by inverters 1350 and 1355.

Figure 14A:
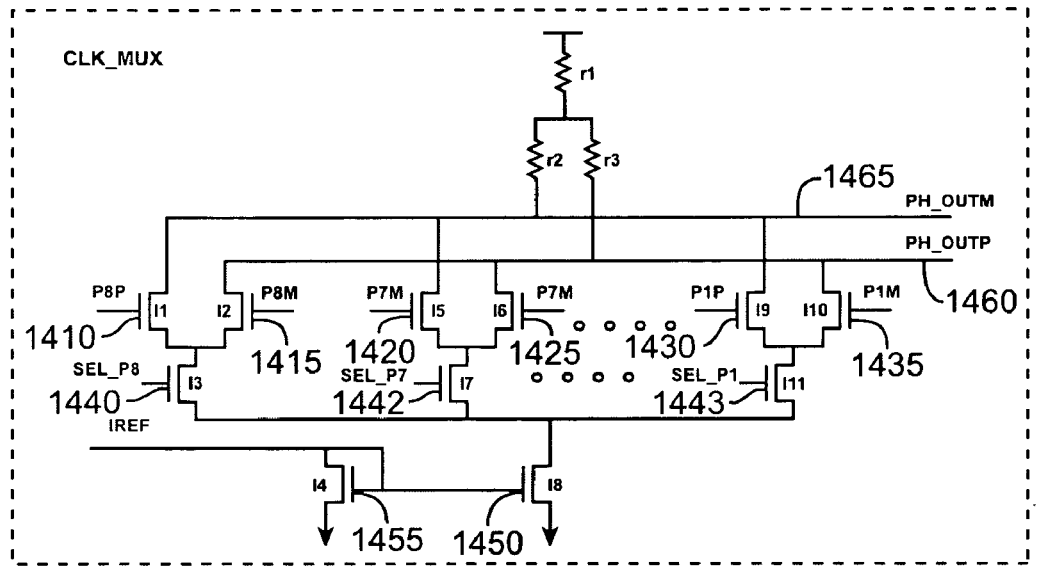
FIG. 14A illustrates a clock mux that may be used as the clock mux in FIG. 11A or as a clock mux in other embodiments of the present invention.

FIG. 14A illustrates a clock mux that may be used as the clock mux 1130 in FIG. 11A or as a clock mux in other embodiments of the present invention. Included are a number of different input pairs including devices I1 1410 and I2 1415, I5 1420 and I6 1425, and I9 1430 and I10 1435. These input pairs are selected by the active device among devices I3 1440, I7 1442, and I1 1443. Device I8 1450 provides a current mirrored from the current in I4 1455 for the mux. A differential output voltage is provided on lines PHOUTP 1460 and PHOUTM 1465. In a specific embodiment of the present invention, the clock mux selects from one of eight inputs. In other embodiments of the present invention, other numbers of clock signals may be selected from.

Figure 14B:
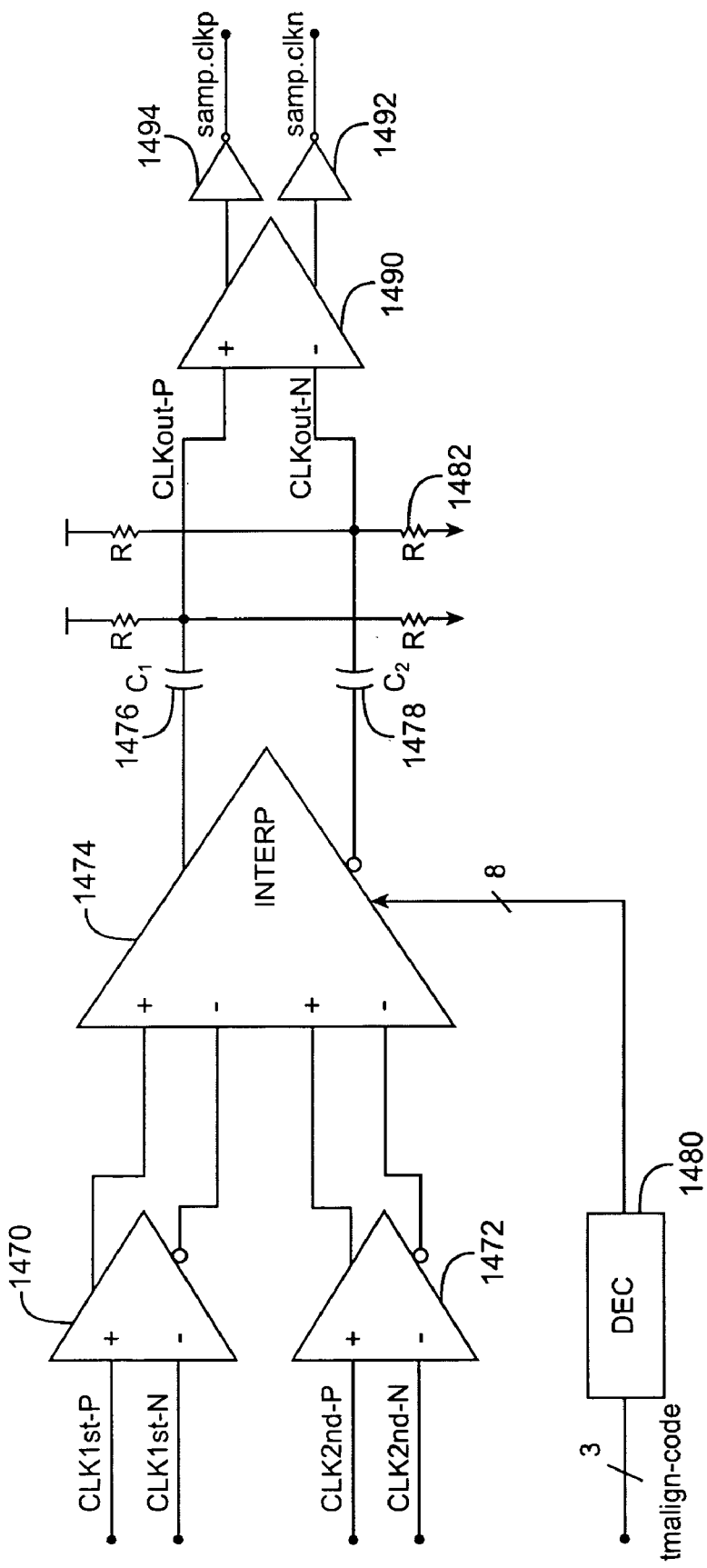

FIG. 14B is a block diagram of a phase interpolator that may be used as the phase interpolator in FIG. 11A. This figure includes differential amplifiers 1470 and 1472, decoder 1480, interpolator 1474, AC coupling capacitors 1476 and 1478, DC restoration resistors 1482, voltage comparator 1490, and output buffers 1492 and 1494.

The phase interpolator block is a linear current-weighted interpolator which receives its inputs from the two input differential amplifiers. These two differential amplifiers condition the signals with the proper rise and fall times acceptable to the interpolator cell. The main interpolator cell increases or decreases the signal-in to signal-out delay based on 8 bit linear cod. With a code of 11111111, the entire delay of the interpolator is from the first section of the interpolator and with a code of 0000000 its entirely controlled by the second section. All other codes provide delays in between. The resolution of this interpolator is 12.5 ps (100 ps/8).

The output of the interpolator is AC coupled to remove any offsets. The DC level is restored by DC resistors 1482 coupled to the input of voltage comparator 1490. The voltage comparator 1490 gains the signal provided by the phase interpolator 1474 and provides an output that is further gained by output buffers 1492 and 1494.

Figure 14C:
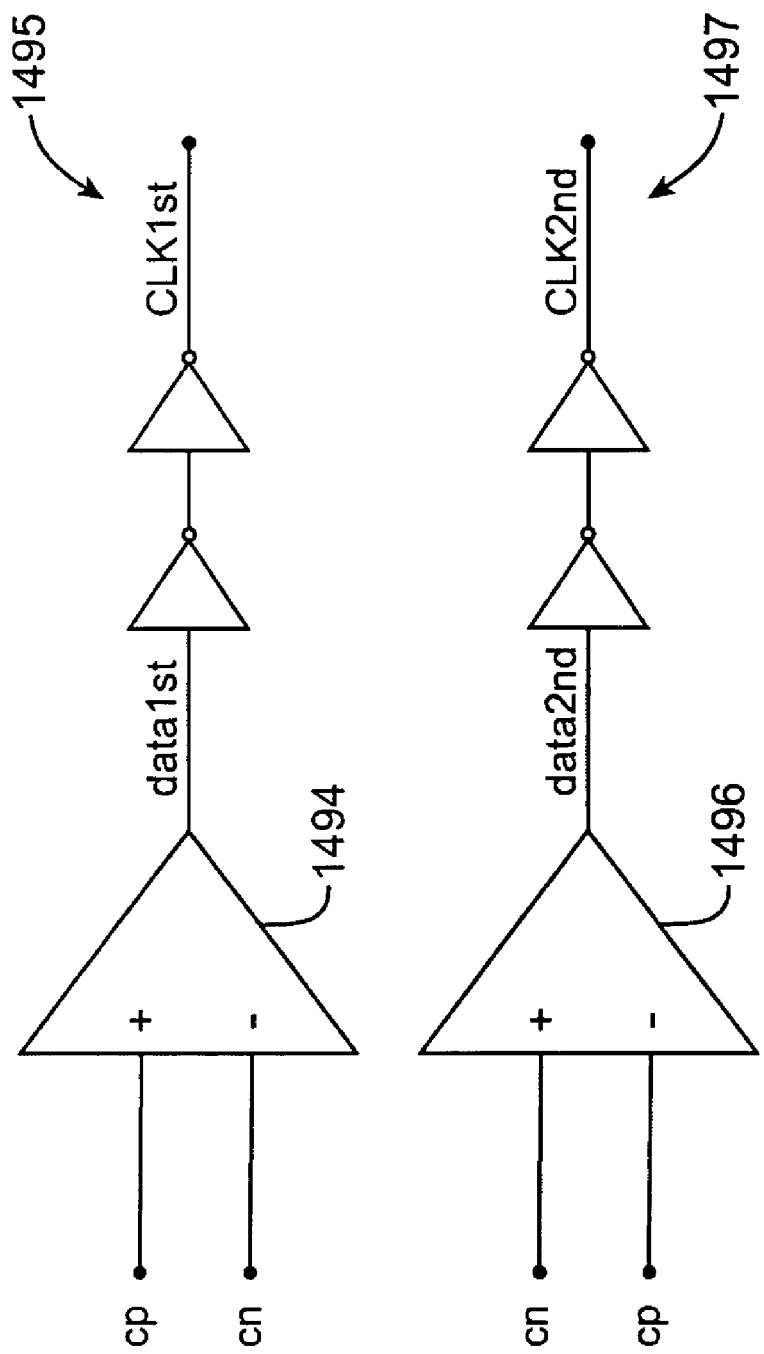
FIG. 14C is a block diagram of a clock self-timer that may be used as the clock self timer 1150 in FIG. 11 and in the other figures and embodiments of the present invention.

FIG. 14C is a block diagram of a clock self-timer that may be used as the clock self timer 1150 in FIG. 11 and in the other figures and embodiments of the present invention. This block diagram includes amplifiers 1494 and 1496, and output buffer inverters 1495 and 1497. The amplifiers 1494 and 1496 may be the same or similar and structure as the receive amplifiers shown previously, or they may be other differential amplifiers.

Figure 15:
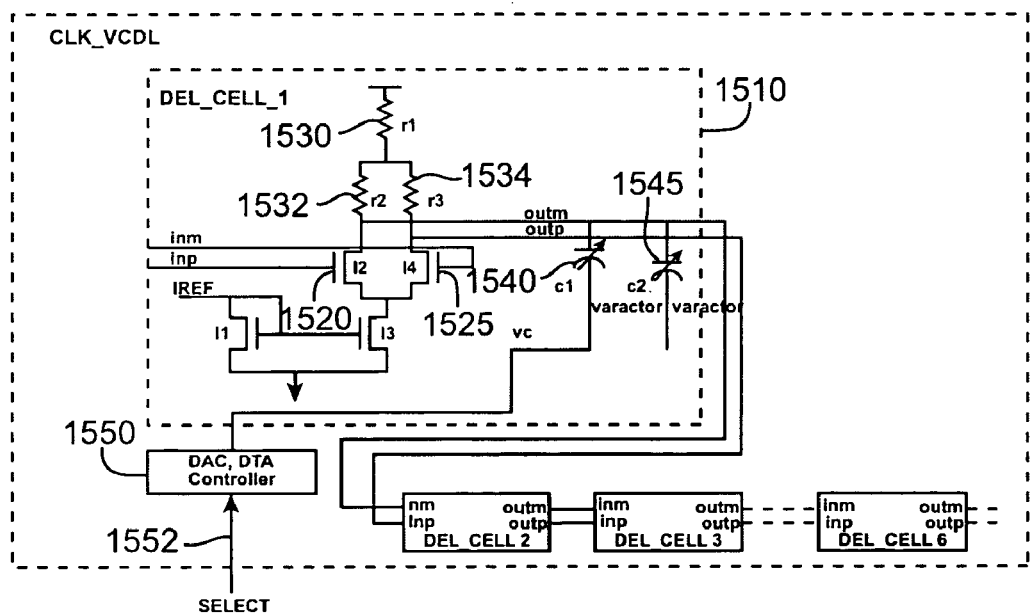
FIG. 15 illustrates a CLK VCDL that may be used as the CLK VCDL in FIG. 11A, or as a CLK VCDL in other embodiment of the present invention.

FIG. 15 illustrates a CLK VCDL that may be used in place of the phase interpolator 1140 in FIG. 11A, or as a CLK VCDL in other embodiment of the present invention. The CLK VCDL 1140 includes a number of a of delays cells 1510. In one specific embodiment of the present invention, there are 6 delay cells, in other embodiments of the present invention there may be different numbers of cells. Each cells includes a differential pair made up a I2 1520 and I4 1525 having load resistors R1 1530, R2 1532, and R3 1534, and varactor capacitors 1540 and 1545. The delay through each cell is proportional to the capacitance of the varactor capacitors C1 1540 and C2 1545. The capacitance of these varactor capacitors (or varactor diodes) is controlled by the DC voltages across them. This voltage is controlled by a DAC, DTA controller 1550, which receives a number of bits on a select bus 1552. These bits are select codes that shift or delay the clocks for fine grain alignment within a select coarse-grain timing window.

In a specific embodiment of the present invention, a select code is determined, stored, and provided to each of the delay cells 1510. In this embodiment, the range of change in delay is one-half of a clock cycle in each direction. This allows for changes, jitter or slips in the data of a full half clock cycle. The select code is changed to allow optimal data recovery. The adjustment of these delay cells forms the fine grain clock alignment.

Figure 16:
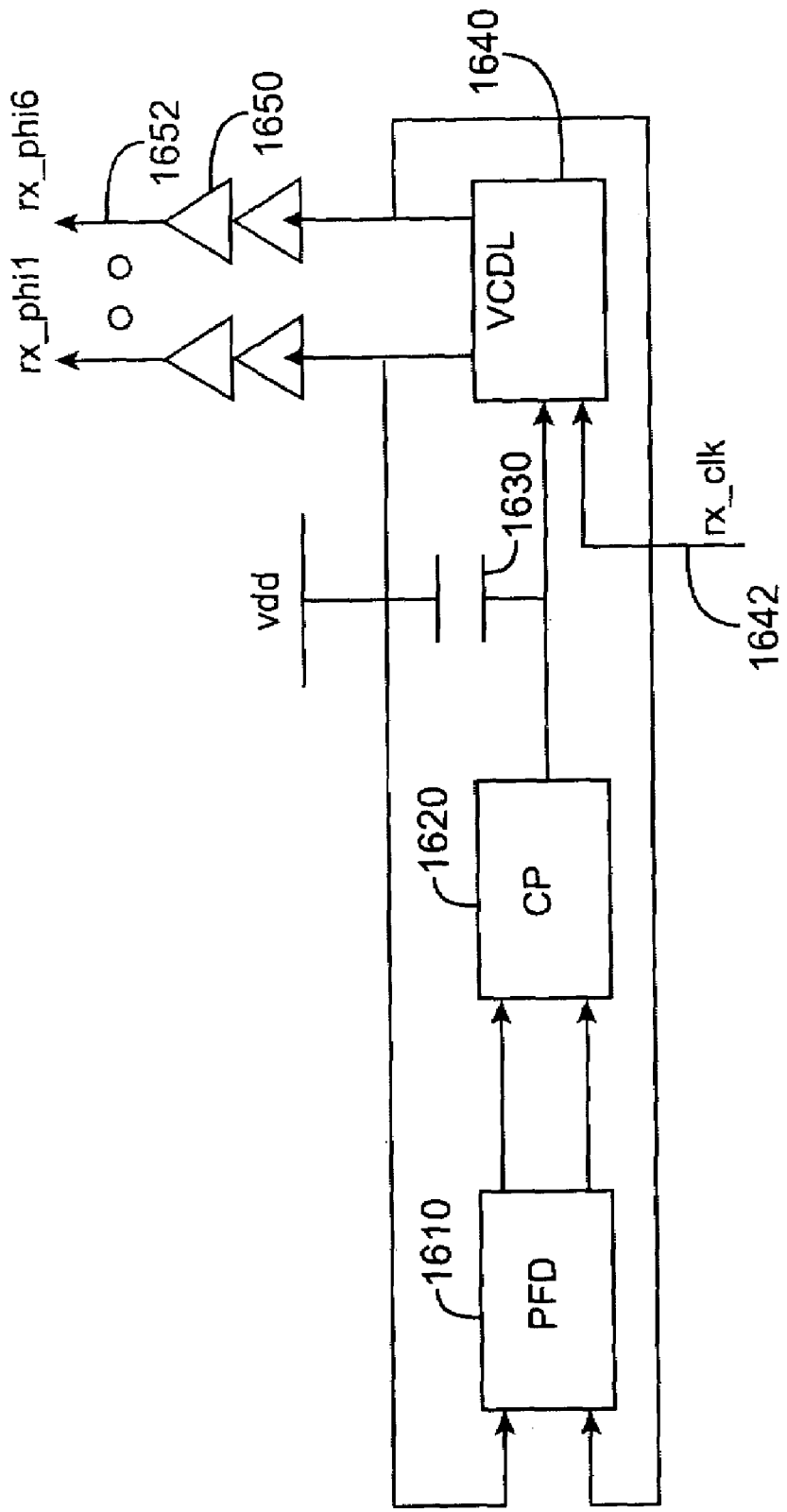
FIG. 16 is a schematic of a phase-locked loop (PLL) or Delay Locked Loop (DLL) that may be used as part of the receiver clock sync and alignment circuit in FIG. 9 or as a PLL or DLL in other embodiments of the present invention.

FIG. 16 is a schematic of a phase-lock loop that may be used as part of the receiver clock sync and alignment circuit 930 in FIG. 9 or as a phase locked-loop in other embodiments of the present invention. Included are a phase frequency detector 1610, charge pump 1620, loop filter 1630, illustrated here as a simple capacitor 1630, VCDL 1640, and output buffers 1650. The VCDL 1640 may be similar to the VCDL as illustrated in FIG. 15. The VCDL 1640, phase frequency detector 1610, and charge pump 1620, form a loop that oscillates at a frequency that is other equal to, or a harmonic of, the reference clock rx-clock received on line 1642. This reference clock is typically the clock signal received from the data source, for example the clocks on lines 940 in FIG. 9.

The VCDL 1640 includes a chain of delay elements, such as the delay cells in FIG. 15, and the output of the chain ties to its input. The output of each element in the VCDL 1640 may be tapped and buffered by buffers 1650 and provided as outputs 1652. These outputs are separated in phase from each other by 2π radians divided by the number of elements in the VCDL circuit 1640. For example, 8 elements may be used to generate 8 phase related clock signals, each clock signal 45 degrees apart in phase. These clock signals may then be selected by a clock mux or other select circuit such as the clock mux 1130 in FIG. 11A. Again, this selection forms the coarse grain clock alignment. One phase locked loop such as the one illustrated here may be used to drive a clock mux for each channel, and different channels (data pins) may determine that a different clock phase results in optimal data reception for that channel.

Figure 17:
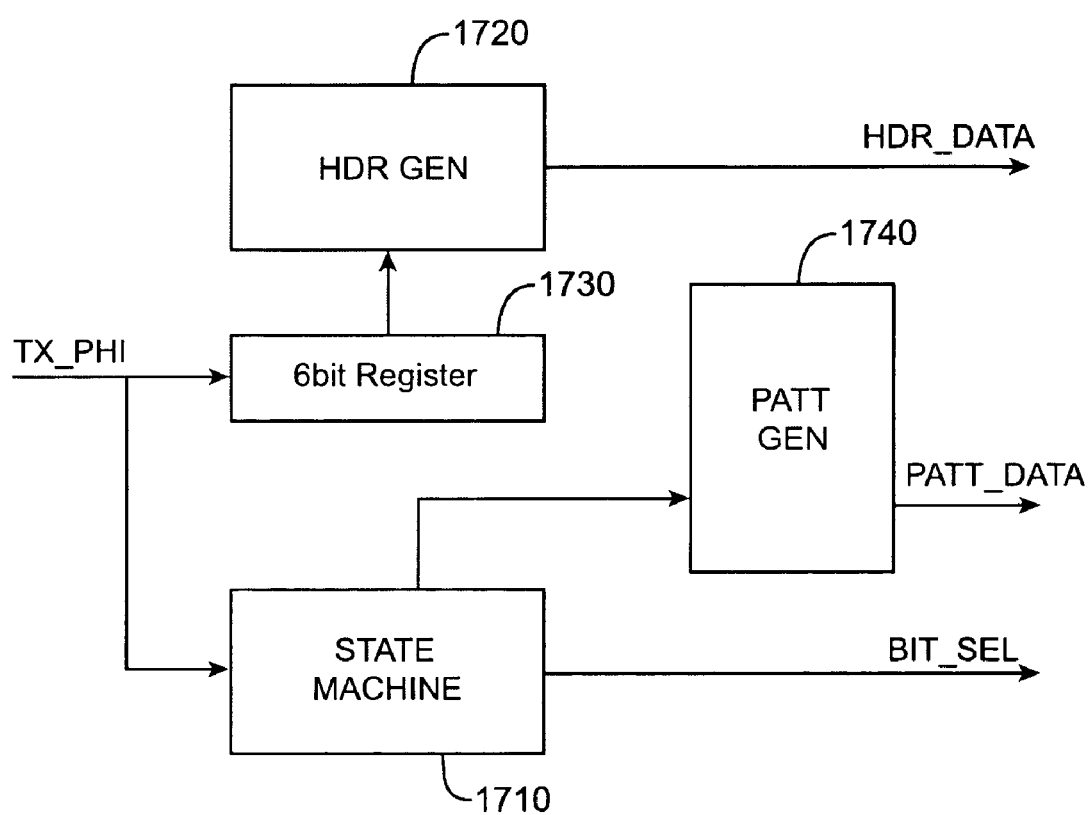
FIG. 17 is a block diagram of header and pattern generating circuitry that may be used on integrated circuits consistent with an embodiment of the present invention.

FIG. 17 is a block diagram of header and pattern generating circuitry that may be used on integrated circuits consistent with an embodiment of the present invention. This block diagram includes a header generation circuit 1720, shift register 1730, state machine 1710, and pattern generator 1740.

The header generator 1720 provides header information to a second integrated circuit (not shown). The header is followed by a data pattern or training sequence provided by pattern generator 1740. The state machine 1710 tracks the current state of any ongoing alignment procedure.

One specific embodiment of the present invention uses 32 ones, followed by 32 zeros as the header. Following the header, a training sequence is provided:

101010101010 (alternating one-zero)

110011001100 (one-one-zero-zero)

000000100000 (lonely or single one)

111111011111 (lonely or single zero).

This sequence is repeated once for each phase shift, one pin at a time. Once all the clocks signals to the data pins on one of the two integrated circuits are aligned, the two integrated circuits swap roles, and the other integrated circuit provides header and training sequences for the other's alignment.

Figure 18:
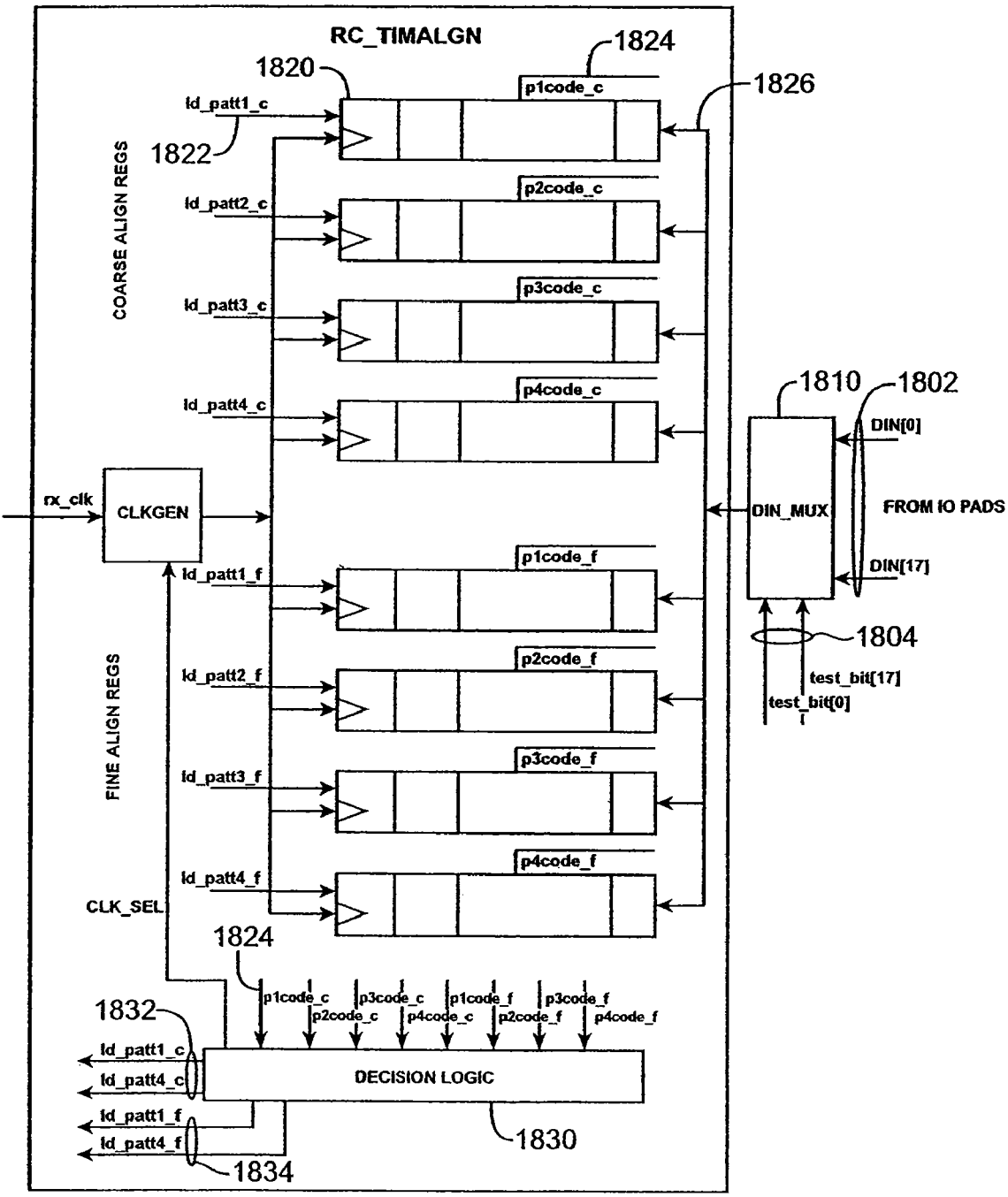
FIG. 18 is a block diagram of a dynamic timing alignment circuit consistent with an embodiment of the present invention.

FIG. 18 is a block diagram of a dynamic timing alignment circuit consistent with an embodiment of the present invention. A training sequence is received on lines 1802 from the input pads (not shown). Input select lines 1804 select the input signal corresponding to the input cell that is currently being aligned. A training sequence is provided by the input mux 1810 to the registers 1820. The registers 1820 store the received training data provided on line 1826 by the multiplexer 1810. The registers 1820 are each clock by one of the phase shifted clock signals. The expected pattern 1822 is also stored in the register is 1820.

The registers 1820 compare the receive data with the expected to the data and generate and output on lines 1824. The signals on lines 1824 are received by decision logic 1830. Decision logic circuit 1830 provides select lines 1832 and 1834 which select the optimum coarse and fine clock phase-shift.

Figure 19A:
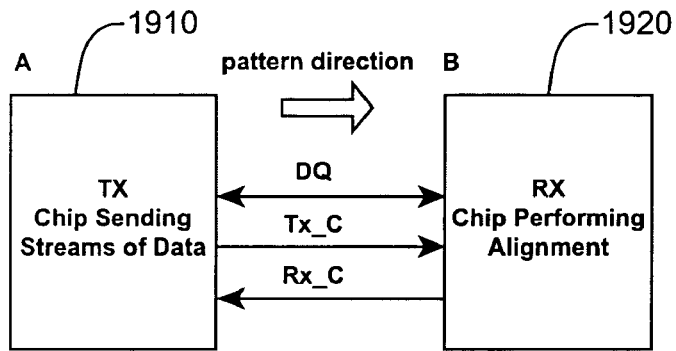
FIG. 19A shows the training pattern flow from a first integrated circuit to a second integrated circuit and FIG. 19B illustrates timing signals for a training pattern consistent with an embodiment of the present invention.

FIG. 19A shows the training pattern flow from a first integrated circuit to a second integrated circuit. A first integrated circuit 1910 provides header and training sequences to a second integrated circuit 1920. Once the clock signals to the receive cells of the second integrated circuit 1920 are aligned, the pattern transmission direction reverses, and the second integrated circuit 1920 provides header and training sequences to the first integrated circuit 1910.

Figure 19B:
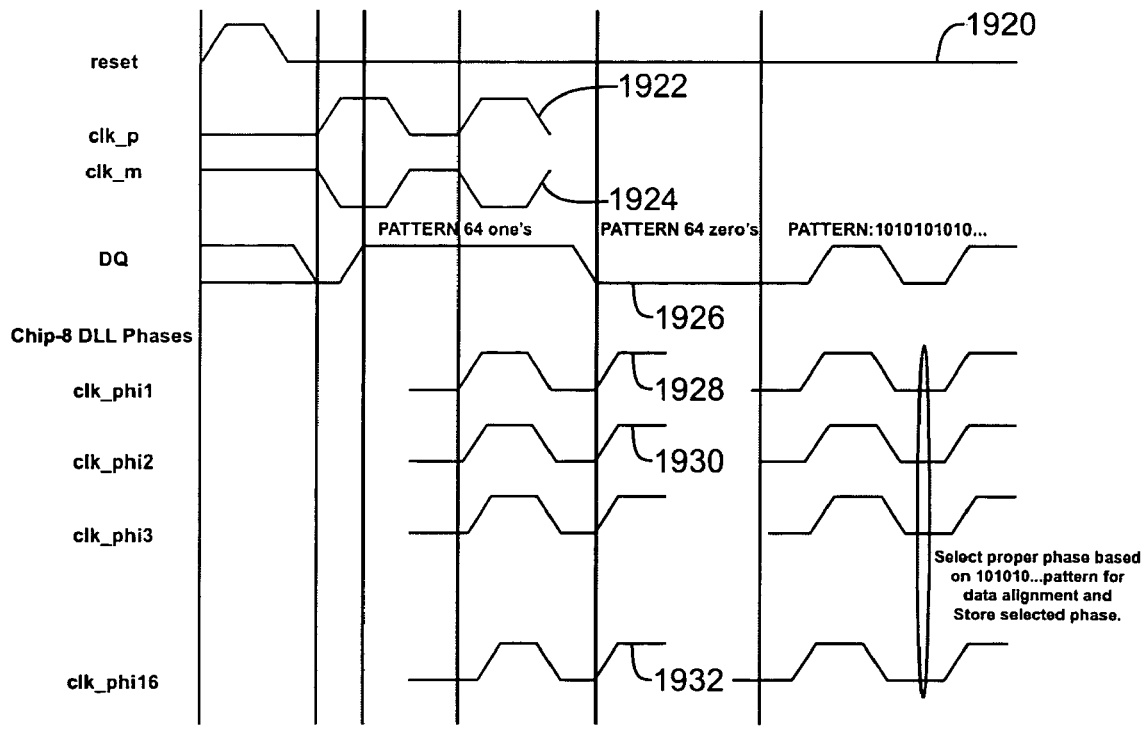

FIG. 19B illustrates timing signals for a training pattern consistent with an embodiment of the present invention. A pulse in the reset signal 1920 begins the alignment sequence. The clocks 1922 and 1924 are received and phase shifted to generate phase-shifted clock versions 1928, 1930, and 1932. The input pin receives header information including zeros and ones, followed by a training sequence 1926, as described above.

This alignment is typically performed at power-up of the system incorporating these integrated circuits. The alignment may be redone periodically. For example, it may be redone after a predetermined time, and this predetermined time may be programmable. Alternately, the alignment may be redone after an error or fault condition arises.

The training sequence is received and stored by 8 coarse registers, each coarse register corresponding to a coarse phase-shifted clock. Once the optimal coarse phase shifted clock is determined, the training sequence is received and stored by 8 fine registers, each fine register corresponding to one of 8 phase shifted clocks within the coarse phase-shift step. Particularly for this second procedure, more than one phase shifted clock may correctly receive the training pattern, that is there may be more than one "hit." In this specific embodiment, 8 coarse phases and 8 fine phases per coarse phase is presented for a total of 64 fine-grain phases. Any other level of granularity may be chosen for other embodiments, Since there can be more than one hit, there is a procedure by which the optimal phase shifted clock is selected. In essence, the phase-shifted clock corresponding to the center hit is selected, as described below.

Figures 20A, 20B:
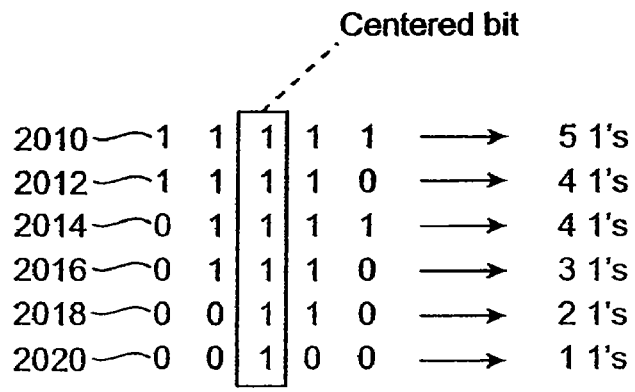
FIGS. 20A and 20B illustrate methods of selecting an aligned clock signal from a number of possibilities according to an embodiment of the present invention.

FIGS. 20A and 20B illustrate methods of selecting an aligned clock signal from a number of possibilities according to an embodiment of the present invention. As can be seen, the center hit is selected.

In these examples, five hits are shown. In a specific embodiment of the present invention, a minimum of five hits are required for a valid alignment to be presumed. Fewer than five hits results in an error condition that may lead to a retry or fault state. Also, this embodiment requires any grouping of hits to be contiguous. Any "misses" in a series of hits results in an invalid state that may, for example, cause a retry to occur. In one embodiment of the present invention, if there are more than five consecutive hits, only the first 5 are kept, the remainder are discarded or ignored.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of receiving a single-ended data signal comprising:
   receiving a first single-ended data signal;
   receiving a first synchronizing signal;
   aligning a delayed first synchronizing signal to the first single-ended data signal by:
      generating a plurality of synchronizing signals, each synchronizing signal shifted in phase relative to the others;
      selecting a second synchronizing signal from the plurality of synchronizing signals; and
      phase shifting the second synchronizing signal to generate the delayed first synchronizing signal; and
   sensing the first single-ended data signal with the delayed first synchronizing signal.

2. The method of claim 1 further comprising:
   aligning a delayed second synchronizing signal to a second single-ended data signal, wherein the delayed second synchronizing signal is aligned to the second single-ended data signal independently of the alignment of the delayed first synchronizing signal to the first single-ended signal.

3. The method of claim 1 wherein the delayed first synchronizing signal is aligned to the first single-ended data signal by a method comprising:
   a coarse alignment comprising selecting the second synchronizing signal in the plurality of synchronizing signals; and
   a fine alignment comprising phase shifting the second synchronizing signal.

4. The method of claim 1 wherein the delayed first synchronizing signal is aligned to the first single-ended data signal by a method comprising:
   a first alignment comprising selecting a second synchronizing signal in the plurality of synchronizing signals; and
   a second alignment comprising phase shifting the second synchronizing signal of previous stage, wherein the phase shifting of the second synchronizing signal is done with a plurality of delay elements, each in series.

5. The method of claim 4 wherein the coarse and fine alignments are programmable.

6. The method of claim 1 wherein the first single-ended data signal is received at a first pin, the method further comprising:
   transmitting a second single-ended signal using the first pin.

7. The method of claim 1 further comprising:
   after receiving a first single-ended data signal, comparing the first single-ended data signal to a threshold voltage.

8. The method of claim 2, wherein the second synchronizing signal is differential.

9. The method of claim 1 wherein the first single-ended data signal is provided by a first integrated circuit and received by a second integrated circuit.

10. The method of claim 9 wherein the second integrated circuit comprises a memory.

11. The method of claim 9 wherein the first integrated circuit comprises a first peripheral device and the second integrated circuit comprises a second peripheral device.

12. The method of claim 9 wherein the first integrated circuit comprises a network interface and the second integrated circuit comprises a memory.

13. The method of claim 9 wherein the first integrated circuit comprises a first network interface and the second integrated circuit comprises a second network interface.

14. The method of claim 9 wherein the first integrated circuit is on a first board and the second integrated circuit is on a second board.

15. A method of receiving a high-speed single-ended signal comprising, for each of a plurality of data pins:
   receiving a preamble signal;
   selecting a first clock signal from a plurality of clock signals, each of the clock signals in the plurality of clock signals phase shifted relative to each other;
   delaying the first clock signal by a first duration;
   detecting errors in the received preamble signal and storing the number of errors as a first value;
   delaying the first clock signal by a second duration;
   detecting errors in the received preamble signal and comparing the number of errors to the first value and storing the lowest value as a second value;
   selecting a second clock signal from the plurality of clock signals;
   delaying the second clock signal by the first duration; and
   detecting errors in the received preamble signal and comparing the number of errors to the second value and storing the lowest value as a third value.

16. The method of claim 15 comprising:
   delaying the second clock signal by the second duration;
   detecting errors in the received preamble signal and comparing the number of errors to the third value and storing the lowest value as a fourth value;
   repeating the process until there are no errors in the received preamble signal; and
   saving the delay code as the final value.

17. The method of claim 16 further comprising:
   selecting one of the plurality of clock signals and delaying the selected clock signal by a duration, the selection and duration determined by the final value.

18. The method of claim 16 further comprising repeating the delaying, detecting, repeating, and saving for each of the remaining plurality of data pins.

19. An integrated circuit comprising:
   a phase-locked loop or DLL configured to receive a clock signal and provide a plurality of clock signals, each clock signal in the plurality of clock signals separated in phase from the other clock signals in the plurality of clock signals;
   a first multiplexer configured to receive the plurality of clock signals and select a first clock signal;
   a first delay circuit configured to receive the first clock signal and delay the first clock signal a first duration to provide a delayed first clock signal; and a first sense amplifier configured to receive a first data signal and the delayed first clock and further configured to provide a first output.

20. The integrated circuit of claim 19 wherein the selection of the first signal and the first duration are programmable.

21. The integrated circuit of claim 19 further comprising:
a second multiplexer configured to receive the plurality of clock signals and select a second clock signal;
a second delay circuit configured to receive the second clock signal and delay the second clock signal a second duration to provide a delayed second clock signal; and
a second sense amplifier configured to receive a second data signal and the delayed second clock and further configured to provide a second output.

* * * * *